United States Patent
Spitzlsperger et al.

(10) Patent No.: US 10,002,836 B2
(45) Date of Patent: Jun. 19, 2018

(54) METHOD OF FABRICATING A SEMICONDUCTOR DEVICE AND SEMICONDUCTOR PRODUCT

(71) Applicant: LFoundry S.r.l., Avezzano (IT)

(72) Inventors: Gerhard Spitzlsperger, Ergolding (DE); Carsten Schmidt, Landshut (DE)

(73) Assignee: LFoundry S.r.l., Avezzano (IT)

( * ) Notice: Subject to any disclaimer, the term of this patent is extended or adjusted under 35 U.S.C. 154(b) by 0 days. days.

(21) Appl. No.: 15/121,419

(22) PCT Filed: Feb. 27, 2015

(86) PCT No.: PCT/EP2015/054170
§ 371 (c)(1),
(2) Date: Aug. 25, 2016

(87) PCT Pub. No.: WO2015/128479
PCT Pub. Date: Sep. 3, 2015

(65) Prior Publication Data
US 2016/0379936 A1    Dec. 29, 2016

(30) Foreign Application Priority Data
Feb. 28, 2014 (EP) .................................... 14157287

(51) Int. Cl.
*H01L 29/66* (2006.01)
*H01L 23/00* (2006.01)
(Continued)

(52) U.S. Cl.
CPC .......... *H01L 23/562* (2013.01); *H01L 21/743* (2013.01); *H01L 21/76224* (2013.01);
(Continued)

(58) Field of Classification Search
USPC ........................................................ 257/139
See application file for complete search history.

(56) References Cited

U.S. PATENT DOCUMENTS 5,841,166 A    11/1998    D'Anna et al.
6,507,050 B1    1/2003    Green
(Continued)

FOREIGN PATENT DOCUMENTS

FR    2848724 A1    6/2004
FR    2895566 A1    6/2007
(Continued)

OTHER PUBLICATIONS

International Search Report corresponding to Application No. PCT/EP2015/054170, European Patent Office, dated Jun. 1, 2015; (6 pages).

(Continued)

*Primary Examiner* — Jami M Valentine
(74) *Attorney, Agent, or Firm* — Nixon Peabody LLP

(57) ABSTRACT

A method of fabricating a semiconductor product including processing of a semiconductor wafer from a front surface including structures disposed in the substrate of the wafer adjacent to the front surface and forming a wiring embedded in a dielectric layer disposed on the front surface. The wafer is mounted to a carrier wafer at its front surface so that material can be removed from the backside of the wafer to thin the wafer. Backside processing of the wafer includes forming implantations from the backside, forming deep trenches to isolate the structures from other structures within the wafer, forming a through-silicon via to contact features on the frontside of the wafer, and forming a body contact. Several devices can be generated within the same wafer.

21 Claims, 20 Drawing Sheets

(51) Int. Cl.
*H01L 21/768* (2006.01)
*H01L 21/8234* (2006.01)
*H01L 21/74* (2006.01)
*H01L 21/762* (2006.01)
*H01L 29/06* (2006.01)
*H01L 29/808* (2006.01)
*H01L 29/732* (2006.01)
*H01L 23/522* (2006.01)
*H01L 23/528* (2006.01)
*H01L 27/092* (2006.01)
*H01L 29/417* (2006.01)
*H01L 29/40* (2006.01)
*H01L 29/78* (2006.01)
*H01L 29/08* (2006.01)
*H01L 29/739* (2006.01)
*H01L 29/74* (2006.01)

(52) U.S. Cl.
CPC .......... *H01L 21/76898* (2013.01); *H01L 21/823418* (2013.01); *H01L 23/528* (2013.01); *H01L 23/5226* (2013.01); *H01L 24/43* (2013.01); *H01L 27/092* (2013.01); *H01L 29/0634* (2013.01); *H01L 29/0649* (2013.01); *H01L 29/402* (2013.01); *H01L 29/41708* (2013.01); *H01L 29/66272* (2013.01); *H01L 29/66333* (2013.01); *H01L 29/66681* (2013.01); *H01L 29/66712* (2013.01); *H01L 29/732* (2013.01); *H01L 29/7395* (2013.01); *H01L 29/7811* (2013.01); *H01L 29/7823* (2013.01); *H01L 29/808* (2013.01); *H01L 29/0878* (2013.01); *H01L 29/407* (2013.01); *H01L 29/4175* (2013.01); *H01L 29/41766* (2013.01); *H01L 29/66659* (2013.01); *H01L 29/66696* (2013.01); *H01L 29/7398* (2013.01); *H01L 29/74* (2013.01); *H01L 29/7802* (2013.01); *H01L 29/7824* (2013.01); *H01L 29/7835* (2013.01); *H01L 2224/4502* (2013.01)

(56) References Cited

U.S. PATENT DOCUMENTS

| | | |
|---|---|---|
| 8,426,233 B1 | 4/2013 | Lei et al. |
| 2008/0070379 A1* | 3/2008 | Kikuchi ............ H01L 21/76898 438/460 |
| 2009/0263931 A1 | 10/2009 | Blanchard |
| 2009/0280602 A1* | 11/2009 | Bonifield .............. B81C 1/0023 438/118 |
| 2011/0068387 A1* | 3/2011 | Kitamura ........ H01L 21/823487 257/329 |
| 2012/0086045 A1 | 4/2012 | Molin et al. |
| 2012/0199984 A1 | 8/2012 | Fujita et al. |
| 2012/0248622 A1 | 10/2012 | Sadaka |
| 2012/0256250 A1* | 10/2012 | Schulze ......... H01L 21/823487 257/328 |
| 2012/0273878 A1 | 11/2012 | Mallikarjunaswamy |
| 2013/0323875 A1 | 5/2013 | Park et al. |
| 2014/0217577 A1* | 8/2014 | Mackh .................... H01L 21/78 257/734 |

FOREIGN PATENT DOCUMENTS

| | | |
|---|---|---|
| JP | 2005-175306 A | 6/2005 |
| JP | 2008-166705 A | 7/2008 |
| JP | 2009-105247 A | 5/2009 |
| JP | 2009-124112 A | 6/2009 |
| JP | 2009-295616 A | 12/2009 |
| JP | 2010-147281 A | 7/2010 |
| JP | 2011-071147 A | 4/2011 |
| JP | 2012-129551 A | 7/2012 |
| JP | 2012-216776 A | 11/2012 |

OTHER PUBLICATIONS

International Written Opinion corresponding to Application No. PCT/EP2015/054170, European Patent Office, dated Jun. 1, 2015; (10 pages).

Hu C, Li M, He X, Sun W.; A Review of Super Junction LDMOS. IETE Tech Rev 2011; 25:327-35; http://tr.ietejournals.org/text.asp?2011/28/4/327/83553; Dated 2011; (10 pages).

* cited by examiner

US 10,002,836 B2

METHOD OF FABRICATING A SEMICONDUCTOR DEVICE AND SEMICONDUCTOR PRODUCT

CROSS-REFERENCE TO RELATED APPLICATIONS

This application is a U.S. National Stage of International Application No. PCT/EP 2015/054170, filed on Feb. 15, 2015, which claims the benefit of European Patent Application No. 14157287.5, filed on Feb. 28, 2014, both of which are incorporated herein by reference in their entireties.

TECHNICAL FIELD

The invention relates to a method of fabricating a semiconductor device that processes a semiconductor wafer from a first surface and uses a carrier wafer to which the semiconductor wafer is attached to process the semiconductor wafer from a second surface thereof. The invention relates also to a semiconductor product that can be fabricated according to the method.

TECHNICAL BACKGROUND

Semiconductor wafers are used to manufacture semiconductor devices including bipolar and MOS transistors designed for high-voltage or power applications. According to a conventional manufacturing process, doping regions and isolation regions are all processed from one side of the semiconductor wafer. A typical example of a high-voltage MOS transistor is a laterally diffused MOS transistor (LDMOS) as shown in FIG. 1 the constitution of which is briefly described below.

Provided is a semiconductor substrate 90 disposed in a semiconductor wafer 9 which includes a well doping region 86 that forms the channel of the LDMOS transistor 81, a doping area 85 that forms a drift region. A gate electrode 88 is disposed on a gate oxide on the semiconductor substrate 90. Doping region 78 establishes the source and doping region 79 establishes the drain of the LDMOS transistor. One or more dielectric layers 91 are provided to establish pre- and intermetal dielectric layers on the surface 90a of the semiconductor substrate 90. The dielectric layers 91 embed one or more layers of metal wirings 89. The wirings contact the doping regions and the gate electrode to carry signals and/or current into and from the drain and source doping regions and carry control signals to the gate electrode. For example, the drain electrode is connected to wiring layer portion 885. The gate electrode is connected to wiring layer portion 888. The signals from both wiring layers are available adjacent the surface 90a of the wafer 9. A pad 96 provides a metal connection at the top surface of the dielectric 91 so that a signal or a high voltage output or a drain current is available to the outside of the device so that it can be connected to an external circuit. A passivation 92 covers the top side of the device except the pad areas.

Isolation regions surrounding the LDMOS transistor such as deep trench isolations 99 isolate the transistor from other devices and structures integrated within the wafer. The wafer may include other power devices or a CMOS circuit 80 that comprises a p-channel transistor and an n-channel transistor. The CMOS circuit can include well doping regions 83, source/drain doping regions 84 and gate electrodes including gate oxides 87. The CMOS transistors may be isolated by shallow trenches 82. The CMOS circuit is connected to the wiring layers 89 to receive and output signals that may be used to control the operation of the LDMOS device.

Such a high-voltage LDMOS transistor may be operated at about 0 V (Volt) for the source electrode and about 40 V to 100 V at the drain electrode so that transistors designed for high break down voltages may generate large depletion zones during operation that extend deep into the substrate. Such depletion zones may cause issues with parasitic capacitances and leakage currents that may degrade the performance of the transistor.

Conventional manufacturing processes employ a silicon on insulator (SOI) substrate that includes a buried insulation region 98 such as a buried oxide that isolates the active regions of the wafer from the other portions of the wafer beneath the buried oxide. The thickness of the substrate of the active area of the transistor becomes limited on a SOI substrate. However, the use of a silicon on insulator substrate is complex to manufacture and expensive in terms of costs. Furthermore, the low thermal conductivity of the buried oxide layer makes it difficult to remove heat form the high voltage transistor during operation. The fabrication of vertical high voltage transistors is difficult with a SOI substrate according to the conventional approach because access to the lower electrodes may be complicated and vertical high voltage transistors are difficult to integrate with lateral transistors.

It is therefore desirable to provide a process to manufacture high-voltage and/or power devices that is less complex, generates devices with predictable parameters and is less expensive.

SUMMARY OF THE DISCLOSURE

According to an aspect of the present disclosure, a method of fabricating a semiconductor device comprises the features of claim 1.

According to another aspect of the present disclosure, a semiconductor product comprises the features of claim 12.

According to the disclosed method, the semiconductor wafer that includes already the structures on the frontside of the semiconductor wafer with the wiring levels and the dielectric layer already disposed on the wafer is mounted to a carrier wafer and is then flipped so that it can be thinned from the rear or backside on the rear or back surface. This allows to generate a relatively thin substrate that avoids overly large parasitic capacitances, even when the transistor is operated at high voltages. Furthermore, the thin substrate allows a processing from the backside such as generating doping areas so as to further improve the characteristics of the transistor. Also, another wiring layer can be generated on the back-side of the wafer to contact the substrate and to provide for an electrical path to elements accessible from the backside to the frontside of the wafer by a through silicon via (TSV). The backside metal contact and the TSVs achieve additional flexibility for the wiring of the circuit.

Both the foregoing general description and the following detailed description present embodiments and are intended to provide an overview or framework for understanding the nature and character of the disclosure. The accompanying drawings are included to provide a further understanding of the disclosed embodiments. The drawings illustrate various embodiments, and together with the description serve to explain the principles and operation of the concepts disclosed. Similar, identical or corresponding elements in different figures of the drawings are denoted with the same numerals.

DETAILED DESCRIPTION OF EMBODIMENTS

According to the embodiment shown in FIGS. 2A to 2J, a first or semiconductor wafer which includes prefabricated portions of an LDMOS transistor is attached to a second or carrier wafer so that the frontside of the semiconductor wafer including the LDMOS transistor portion faces the carrier wafer. The composite wafer arrangement of semiconductor wafer and carrier wafer is then treated from the backside of the semiconductor wafer. Specifically, semiconductor material is removed from the first wafer on the rear or backside so that the wafer is substantially thinned. Then, several process steps are performed from the backside to complete the transistor devices including doping, implantation, trench etching, depositing of isolation layers to fill the trenches and isolate the transistors, etching through vias and depositing of conductive layers like metal layers to provide contact to the active areas of the backside of the wafer and provide contact to the wiring layers on the frontside.

Figure 1:
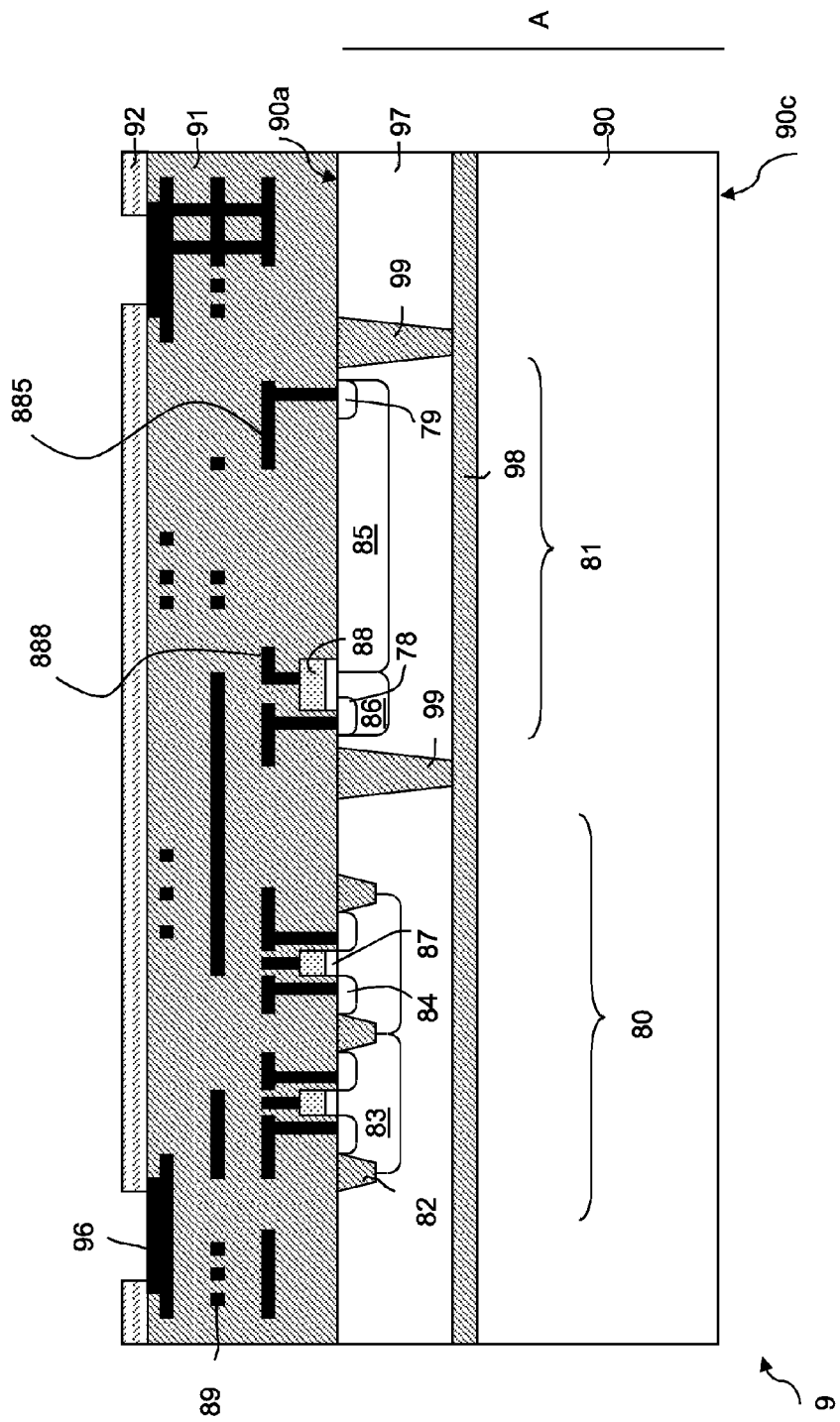
FIG. 1 shows a conventional LDMOS transistor.
Figure 2A:
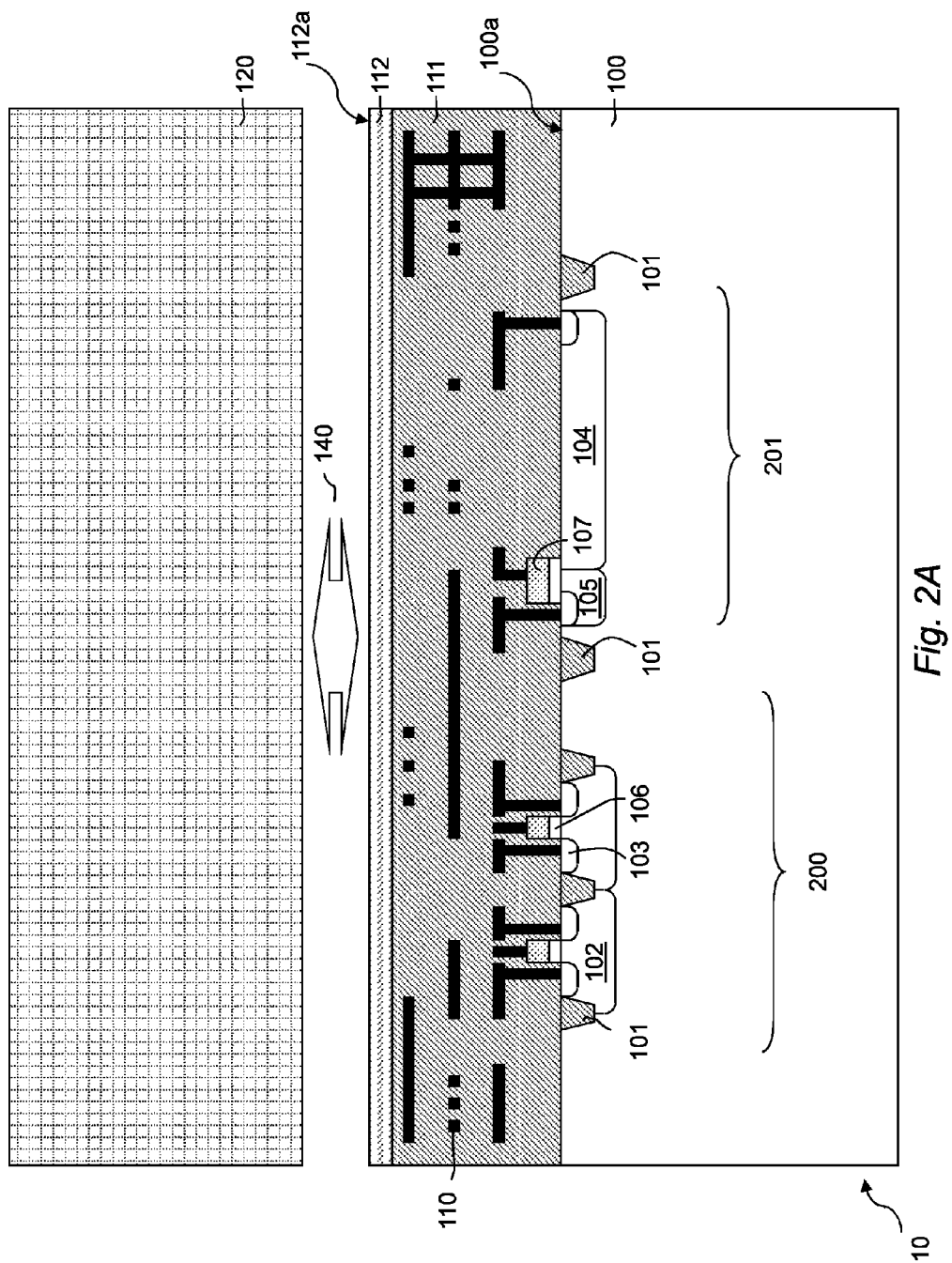
FIGS. 2A to 2J show process steps of the fabrication of an LDMOS transistor according to an embodiment.

In detail, FIG. 2A shows a first wafer 10 including the semiconductor substrate 100 of, e.g., p-type silicon that includes prefabricated portions of an LDMOS transistor 201. An n-type silicon wafer could also be useful. An epitaxial layer 100 that is grown on a silicon substrate is also possible. The epitaxial layer can be either n- or p-type or of undoped silicon. The shown doping areas 104, 105 and shallow trench isolations (STIs) 101 in substrate 100 have been fabricated while accessing the first wafer from the frontside 100a as described in connection with FIG. 1. The first wafer 10 includes also a CMOS circuit 200 comprising a p-channel MOS transistor and an n-channel MOS transistor. A dielectric layer 111 is disposed on the frontside 100a of the first wafer, the top of the dielectric layer 111 is covered by passivation layer 112 forming a top surface 112a. The wirings 110 are embedded in the dielectric layer 111. While area 201 includes one or more high power and/or high voltage devices such as an LDMOS transistor, the area 200 includes one or more low voltage transistors such as a CMOS circuit.

The planarized top surface 112a of the first wafer 10 is to be connected to a carrier wafer 120 by a bonding operation depicted at 140. No bonding pads are formed on the top surface of the dielectric layer 111. The connection between carrier wafer 600 and first wafer 10 at the surface of the dielectric layer 111 is made in accordance with commonly known process steps available to a skilled person to achieve a permanent bond between wafers 10 and 120. The carrier wafer 120 may be a semiconductor wafer as well, however, much less expensive than the device wafer in which the doping areas are included.

One example of a bonding process is described below. The passivation layer 112 may be a composition of several layers. The final top layer of the passivation layer 112 may be silicon nitride and/or silicon oxynitride which may be deposited by PECVD. Then, a bond oxide may be deposited on top of the passivation layer 112. The bond oxide (not shown in FIG. 2A) may be deposited as a TEOS silicon dioxide by PECVD on top of the silicon nitride or the silicon oxynitride. Then, a chemical mechanical polishing (CMP) may be performed to planarize the surface of the bond oxide and ensure sufficient flatness thereof. A sequence of PECVD TEOS depositions and CMP steps could be applied to achieve the required flatness. Then, the surface of the bond oxide is activated by a plasma with an inert gas. Then, the carrier wafer 120 is attached to the top surface of the device wafer 10 applying a suitable mechanical force or pressure. A low temperature bake is performed to strengthen the bonding. The baking process may be in the range of lower than 450° C., preferably lower than 400° C. In theory, it is believed that the bonding relies on Van-der-Waals forces between the top silicon dioxide surface of the bond oxide on top of the device wafer 10 and the silicon surface of the carrier wafer 120. As an alternative, for example, adhesive bonding using polymer adhesives such as benzocyclobutene (BCB) or others may be used as well to achieve a reliable bonding between the device wafer and the carrier wafer.

Figure 2B:
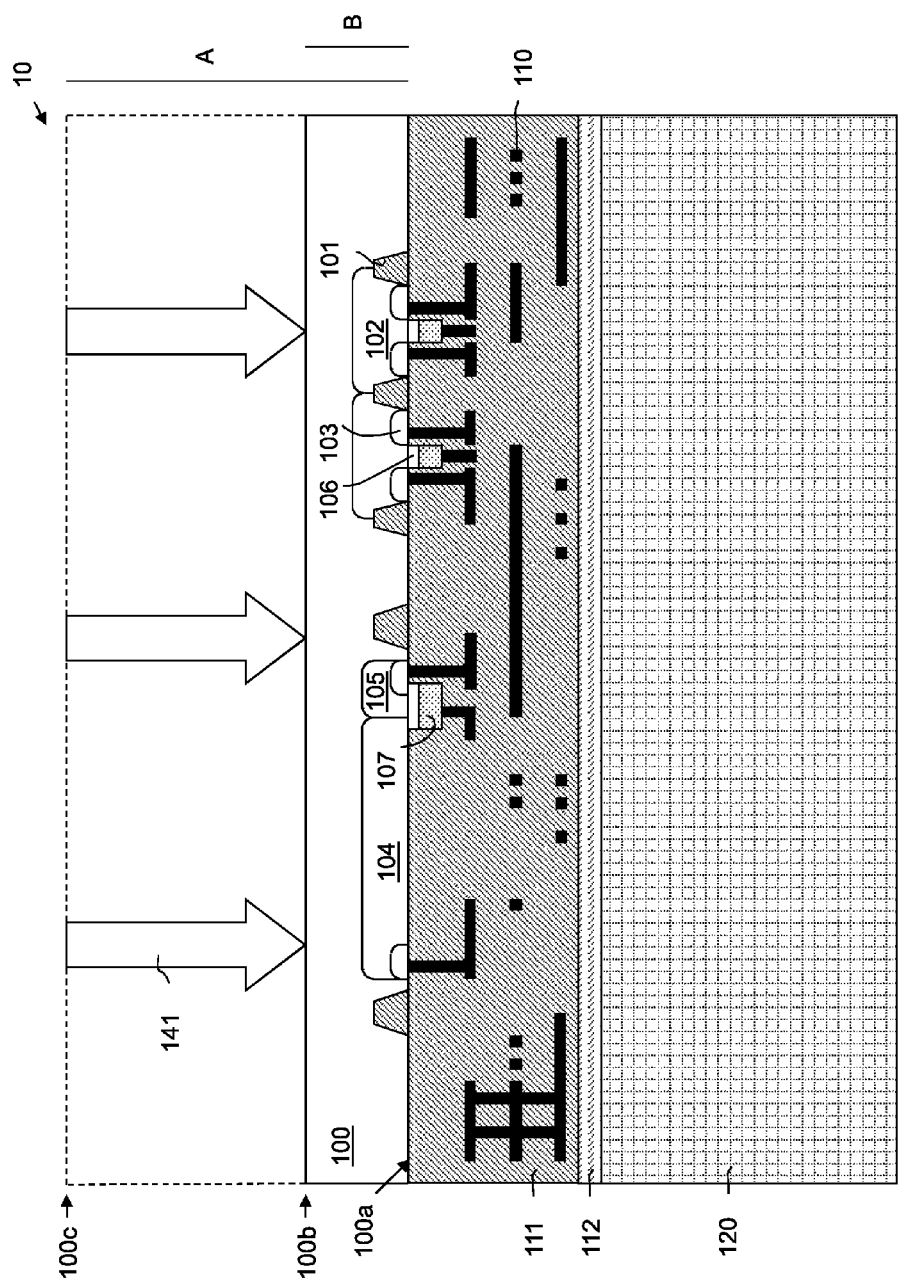

As shown in FIG. 2B, the first wafer or device wafer 10 is treated from its backside after the first wafer 10 has been mounted to carrier wafer 120. The original backside 100c is treated such that material is removed from the backside 100c to substantially reduce the thickness of the first wafer 10 from the original thickness A to a desired thickness B. For example, the backside 100c of the first wafer 10 is grinded as depicted with arrows 141. The thinning of the wafer 10 can include removal processes such as chemical etching like wet etching or dry etching or chemical-mechanical polishing. Any process that is capable of removing a substantial amount of substrate material from the first wafer 10 may be useful for the thinning process. For example, the majority of the backside material can be removed by mechanical grinding followed by a chemical-mechanical polishing process and etchback to obtain a planarized surface 100b at the desired wafer thickness B after the thinning process. The backside surface 100b should have such a condition so that additional processing steps such as deep trench etching, via etching, doping, dopant implanting, deposition of metals and dielectrics are possible.

In one approach, the bulk of the silicon material is removed by backgrinding. The remaining thickness is measured. In a subsequent CMP process the polishing amount is adjusted according to the measured value of the thickness after backgrinding and the target for the final silicon thickness of the device wafer 10. In this approach a good wafer-to-wafer control of the final silicon thickness can be achieved with an acceptable intra-wafer uniformity of the silicon thickness.

In another approach, different dopant densities of the epitaxial layer and the substrate on which the epitaxial layer was grown may be used. The bulk of the silicon material is removed by backgrinding. Then, a wet etchback is performed which stops selectively on the expitaxial layer owing to the different dopant densities of the substrate and the epitaxial layer and the selectivity of the etch process. Then, a CMP process can be performed additionally. With this approach a good wafer-to-wafer control can be achieved in combination with a good intra-wafer uniformity. The final silicon thickness is the same or substantially the same as the thickness of the epitaxial silicon.

While the thickness A of the original first wafer 10 is in the range of 700 μm (micrometers) or at least more than 500 μm, the thickness B established after the thinning process 141 as shown in FIG. 2B is in the range of 2 μm to 50 μm. The thickness B is taken between the top surface 100a of the silicon material of the wafer 10 and the rear or back surface 100b after thinning from the backside of the wafer 10. The thickness may be preferably in the range of 2 μm to 25 μm. Most preferably, the thickness may be in the range of 3 μm to 20 μm. The active areas of high-voltage MOS transistors may have a depth so that the function of the transistor is guaranteed and the parasitic capacitance in the substrate is limited by the reduced, thinned thickness of the wafer.

The handling of carrier wafers and the performance of thinning processes are commonly known and understood operations in the field of semiconductor wafer processing and manufacturing of electronic circuits. Fabrication tools to perform these processes are available of the shelf so that the described processes can be well implemented and achieve predictable and reliable results although they require only moderate expenses. Accordingly, the manufacturing costs of a process using backside thinning are less than the manufacturing costs of using a conventional SOI substrate including generating complex buried isolation structures as described in connection with FIG. 1. Furthermore, the thinned device wafer 10 exhibits several advantages that may not or not as easily be achieved with a conventional SOI wafer such as higher heat dissipation, lower parasitic capacitances, higher electrical currents etc. as described hereinbelow.

Figure 2C:
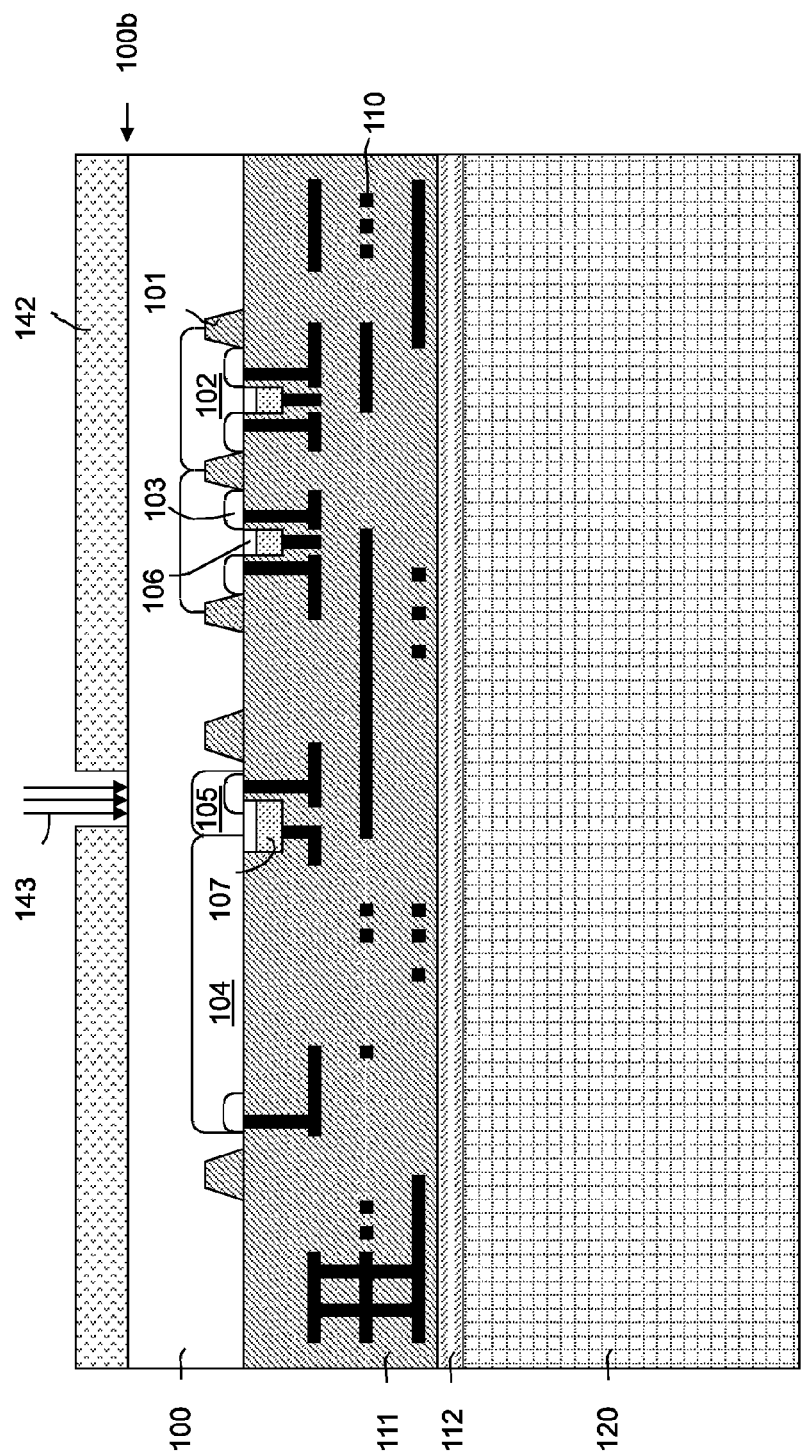

As described in connection with FIGS. 2C to 2J, the LDMOS transistor is completed with as such standardized processes, although performed from the rear or backside of the wafer. As shown in FIG. 2C, a resist mask 142 is applied on the thinned wafer backside 100b to define regions for doping or implantation 143. In FIG. 2C, a masked implantation for a body contact of the LDMOS transistor 201 on the wafer backside is shown. After the implantation 143 the resist is masked is removed.

Several different masked implantations can be applied on the wafer backside for different purposes in connection with the shown LDMOS transistor or with other high voltage transistors on the wafer. Other doping areas such as, for example, buried doping areas can be implanted in the substrate to enhance the transistor characteristics.

For a proper alignment of the photo mask 142 in the masking step performed on the wafer backside to the structures on the wafer frontside such as the doping areas 105 and 104 or elements in the wiring layer 110, alignment marks on the wafer are necessary which have been created by a frontside process and which have been made visible on the wafer back-side. There are several techniques available to a skilled person to accomplish such alignment marks. The thinned semiconductor wafer 10 allows a convenient generation of the doping processes from the backside 100b of the thinned wafer 10 that would be almost impossible to generate from its frontside 100a.

Figure 2D:
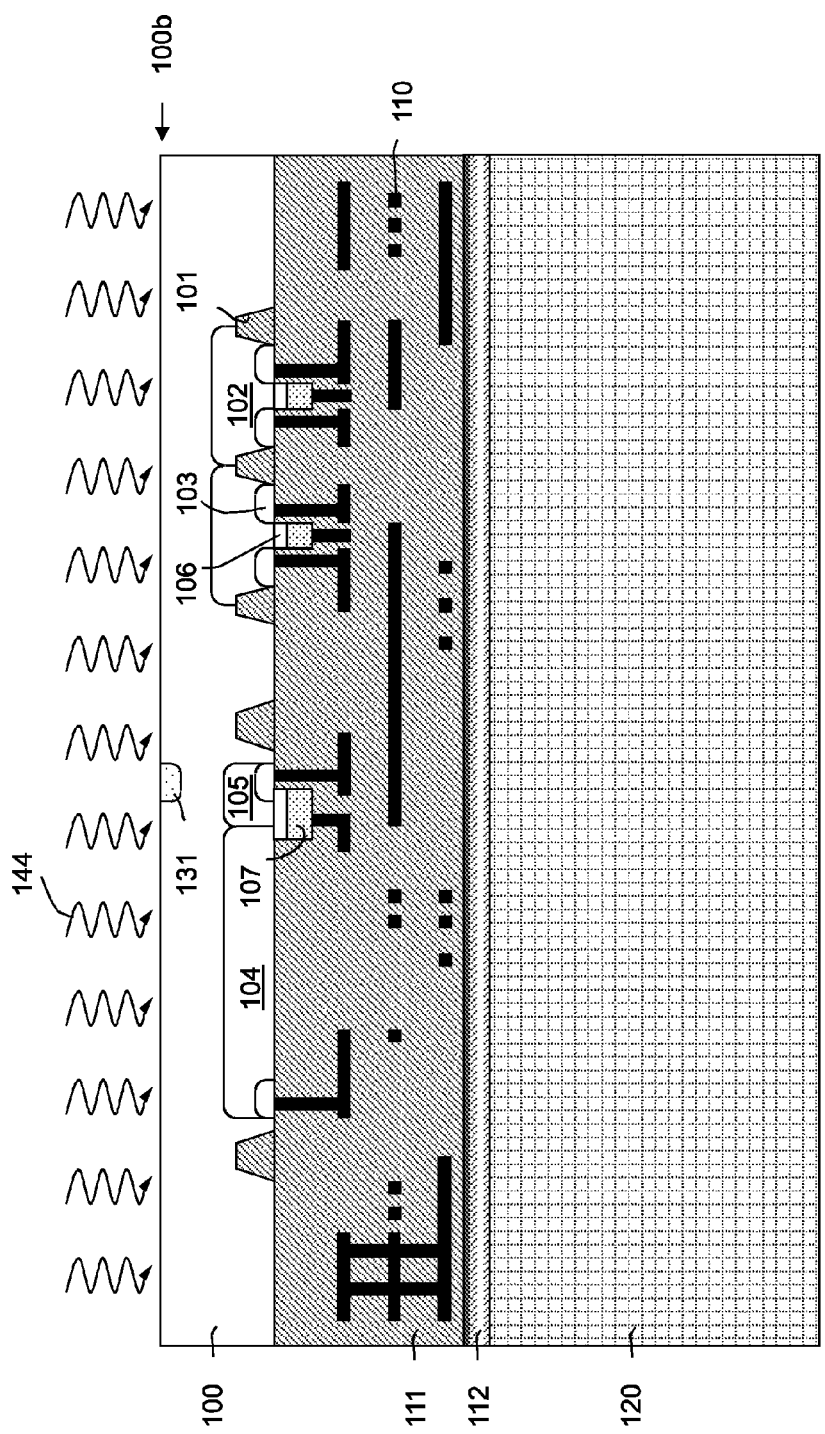

After the implantation of dopant 143 and after the removal of resist mask 142, the doping area 131 is annealed to smooth the doping and heal defects that were generated by the implantation 143 as shown in FIG. 2D. Annealing may be performed by a laser treatment of the thinned backside 100b as shown at 144 to maintain the available thermal budget of the to be generated LDMOS device and the other devices on the wafer such as the CMOS circuit. The laser thermal anneal (LTA) 144 may be performed after all implantations have been made to activate the dopants introduced into the silicon substrate on the backside. During laser thermal annealing the wafer is exposed to very short heat pulses so that the heat can penetrate into the silicon only to a limited depth depending on pulse time, energy dose and wavelength. In this way, dopants can be activated on the wafer backside without ruining a metallization on the frontside which may be based on Aluminum (Al) and also without affecting the thermal budget of the devices. The depth of the thermal impact generated by the LTA is limited due to the nature of LTA so that the doping areas on the frontside of the wafer are not adversely affected. Dopants can be activated until a depth of about 2 μm with state of the art laser thermal annealing equipment.

In an embodiment, the laser thermal anneal may comprise a field that is stepped across the wafer backside surface, wherein several laser pulses may be applied on the wafer while the field stays on a location. For example, the field may have rectangle or square size of, for example, 20 mm*20 mm (millimeters) and the pulses may last for, for example, 200 ns to 300 ns (nanoseconds).

Figure 2E:
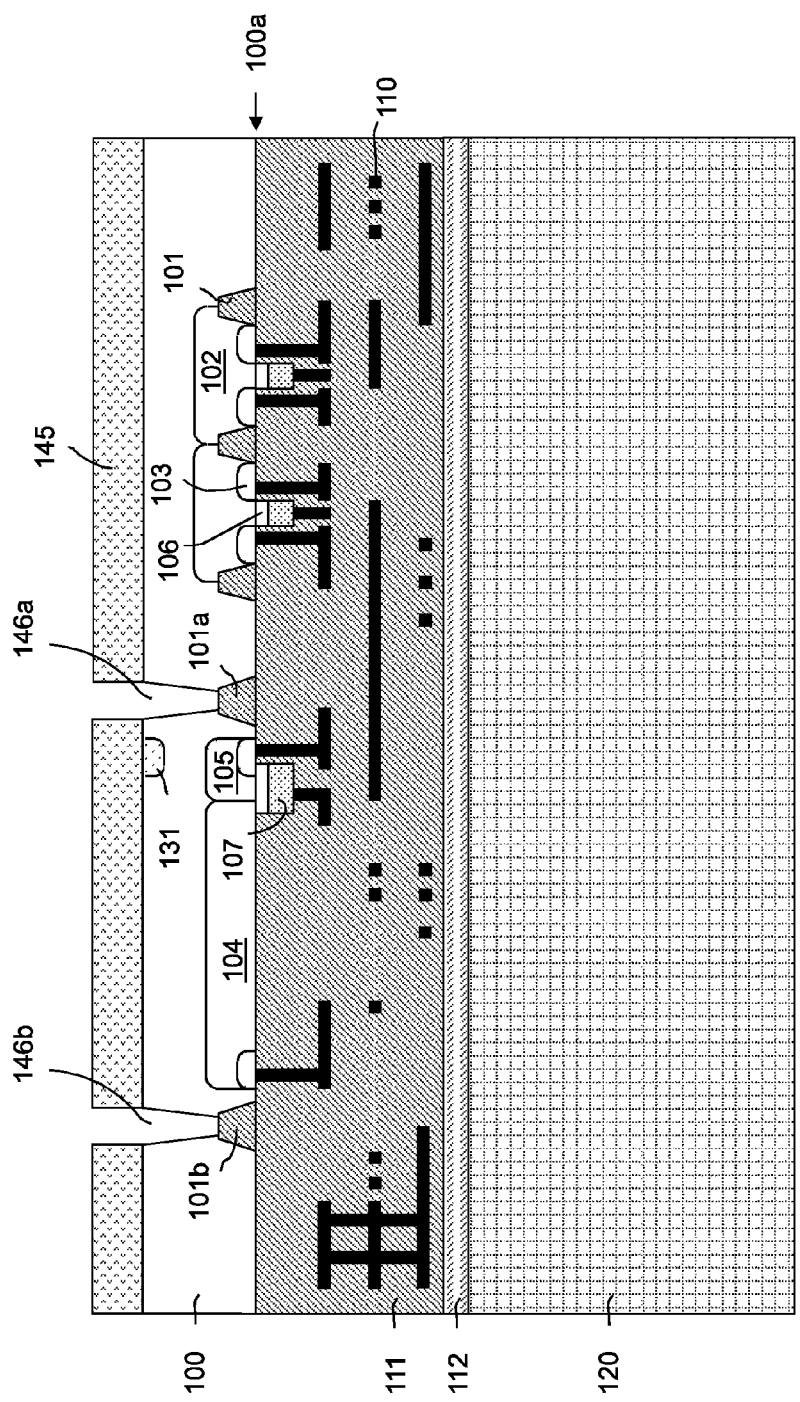

As shown in FIG. 2E, another mask 145 is deposited and patterned on the backside 100b of wafer 10 to define areas to generate deep trenches into the substrate 100. Mask 145 may be a resist mask or may be a hard mask both of which withstand the deep trench reactive ion etching (RIE) process. In the case of a hard mask, a resist mask may be used to define the hard mask which is then used for the deep trench etch. The hard mask may be silicon dioxide. Deep trenches 146a, 146b are etched, for example, by an RIE dry etching process into the substrate 100 to end on the already present shallow trench isolations 101a and 101b, respectively, that have been processed from the frontside 100a of the wafer.

As shown in FIG. 2E, the mask 145 of the deep trench isolation could be such that deep trench isolation are formed only at those positions where shallow trench isolations 101a, 101b exist on the frontside. In this way, the deep trench etch stops selectively on the bottom surface of the silicon dioxide that fills the shallow trench isolations 101a, 101b. It is also possible that deep trench isolations extend to the pre-metal dielectric 111. Alignment marks are required to position the mask on the backside relative to the shallow trench isolations of other structures on the frontside.

Figure 2F:
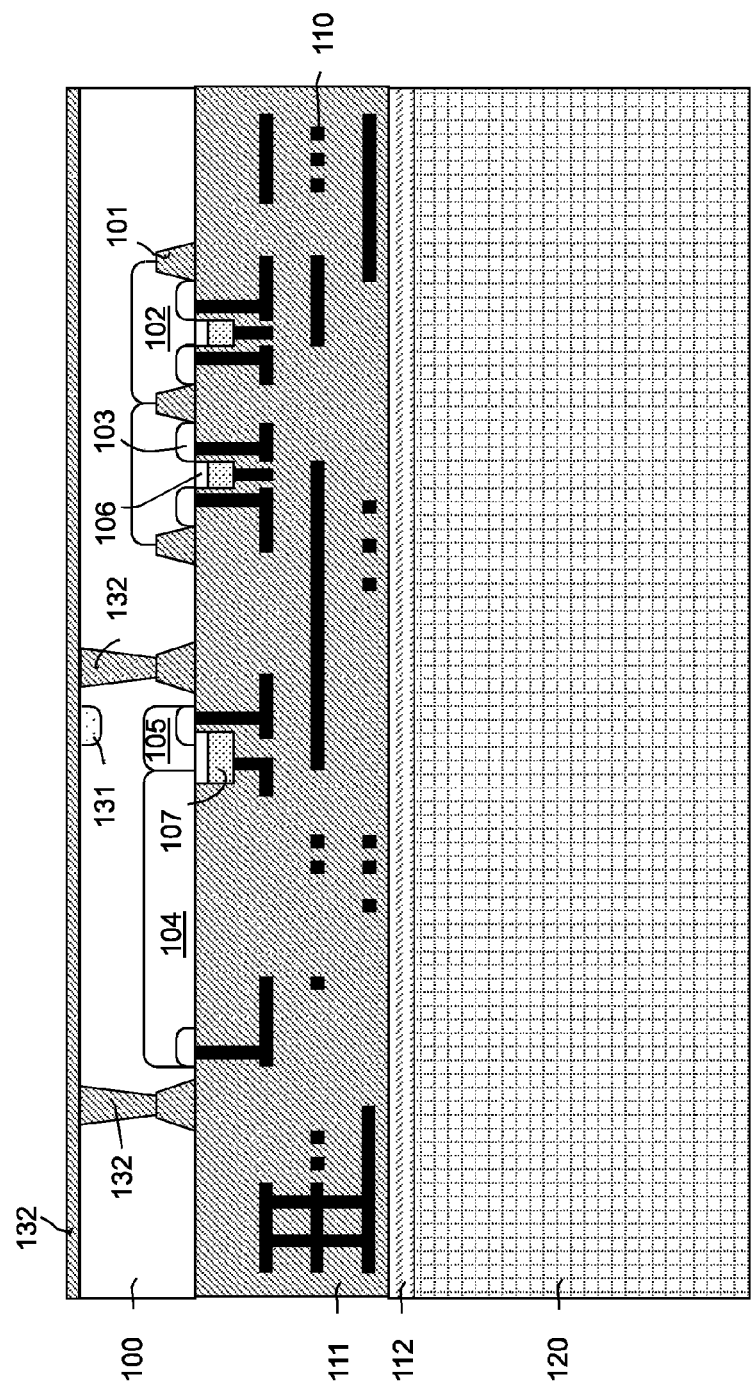

As next shown in connection with FIG. 2F, a dielectric layer is deposited on the backside of the wafer so as to fill up the deep trenches 146a, 146b with dielectric material 132. The insulating material may be a silicon dioxide based dielectric. The insulating material should be processible at temperatures not above of 400° C. in order not to ruin the Al based metallization 110. A sub atmospheric CVD deposition with ozone/TEOS is useful to fill trenches 146a, 146b with oxide material 132. A high density plasma (HDP) CVD silicon dioxide deposition could be applied as well. As another alternative a spin-on dielectric material such as a spin-on glass (SOG) or benzocyclobutene (BCB) is also possible that is applied to the wafer backside by a spin-on process. Other options for filling the trenches 146a, 146b with dielectric material are known to those skilled in the art. The lateral size of the deep trenches may depend on the voltage rating of the LDMOS transistor and the breakdown voltage and leakage of the silicon dioxide based dielectric material. As a result, the active area 104, 105 of the LDMOS transistor is isolated from other features in the semiconductor wafer 10 by the deep isolation trenches 132 plus the shallow trench isolations 101a, 101b. The deep trench isolations formed in deep trenches 146a, 146b form a barrier around the LDMOS transistor and isolate its structures including its doping regions from other structures on the wafer such as the CMOS circuit which comprises other doping regions.

The horizontal portions of the silicon dioxide which is deposited on the silicon surface during the filling of the deep trenches may remain on the backside. If needed, the thickness of the silicon dioxide may be reduced which can be accomplished, for example, by CMP (chemical mechanical polishing).

Figure 2G:
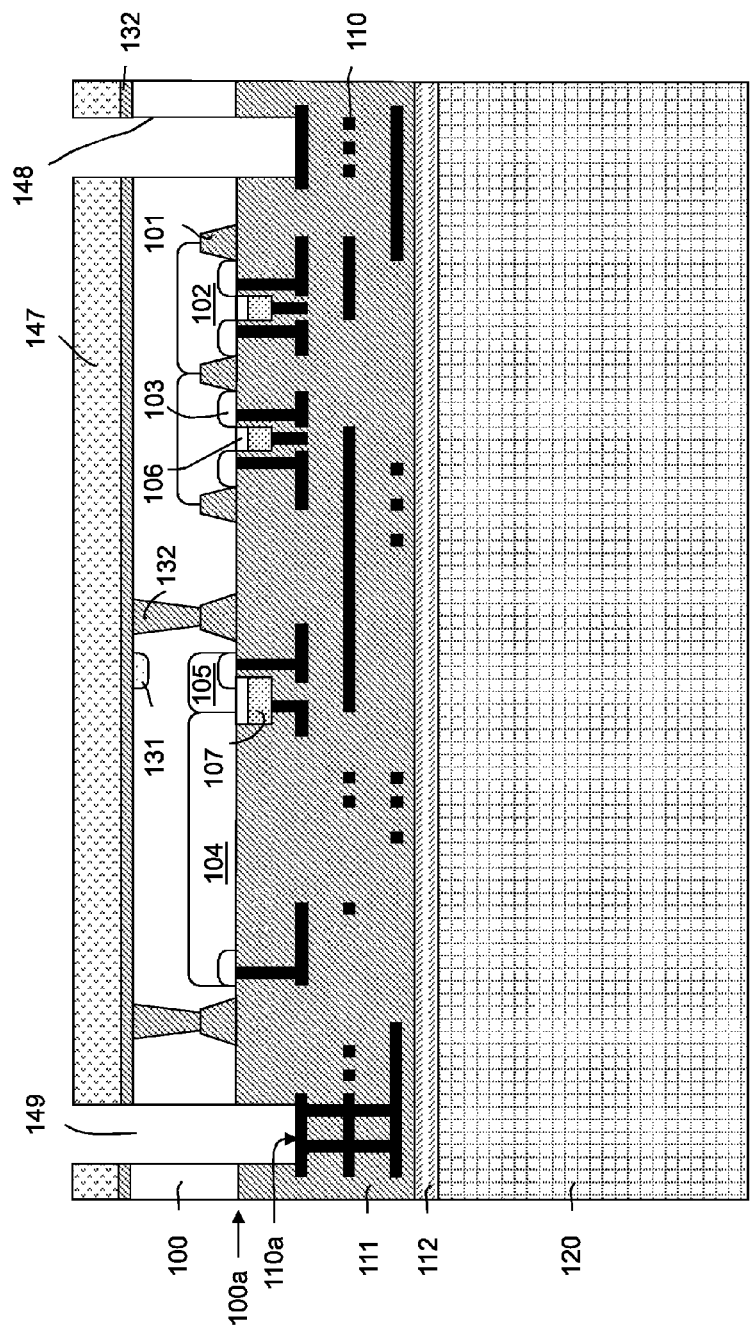

Turning now to FIG. 2G, via holes are etched to establish a connection to the metal wiring 110 disposed on the frontside of the wafer in the dielectric layer 111. The via holes penetrate the full thickness of the thinned wafer and extend from its front surface to its back surface so that such a via hole is also named through silicon via (TSV). The TSVs enable an electrical connection from the frontside to the backside of wafer 10 so that an electrical signal or a current or a voltage can be passed from the frontside of the wafer to the back-side where it can be further processed. The signal, current or voltage can be output from the die on the backside or can be passed again to the frontside through another TSV.

As shown in FIG. 2G, a resist mask 147 is applied on the wafer backside to define the areas for the through silicon vias. Either the resist mask is used directly as mask for the via etch, as shown in FIG. 2G, or the resist mask is used to define a hard mask which is then used as the mask for the via etch. The through silicon via etch process may comprise at least two steps. A first step is the silicon etch which may selectively stop at the frontside 100a of the substrate 100 when the etch process reaches the pre-metal dielectric 111. In a second step the pre-metal dielectric 111 is etched so that the second step stops selectively on the bottom side of metal wiring 110a used in the frontside metallization. This metal wiring 110a may comprise a Ti/TiN barrier as the lowermost layer being closest to the silicon surface 100a. An Al layer may be disposed on the Ti/TiN barrier layer. The Ti/TiN barrier layer may comprise a layer of Ti and a layer of TiN disposed theron. The TSV etch process is controlled to stop on the Ti/TiN barrier layer of wiring layer 110a. The etch chemistry may comprise SF6, O2, HBr so that a via with high aspect ratio, e.g. in the range of about 15:1, is achieved so that the sidewalls of the TSVs have no significant taper and are almost vertical.

The through silicon via may establish a contact to the lowest interconnect level or first metal layer which is the metal layer 110a closest to the front surface 100a of the wafer. It is also possible that the through silicon via extends to the bottom of a higher metal layer creating a contact to that interconnect level.

In FIGS. 2E and 2G, the deep trench etch steps for the deep trenches and for the TSVs are performed with different etch masks, one for the deep trench isolations and another one for the through silicon vias. It is also possible to perform a combined etch step defining both simultaneously, the trenches for the deep trench isolations and the vias for the through silicon vias. In particular, if the silicon thickness after thinning is still high, the latter approach may be preferred. In this case, the etch step will stop on the boundary between silicon 100 and the dielectric, which is the dielectric of the shallow trenches such as 101a, 101b and the dielectric of the pre-/intermetal dielectric 111. In this case, an additional mask is necessary for opening the pre-/intermetal dielectric 111 for the through silicon vias to continue the etching until the metal layer 110a is reached. Turning again to FIG. 2G, two TSVs 148, 149 are etched landing on the lower most metal wiring layer. TSV 148 is positioned next to the CMOS circuit 200, TSV 149 is positioned next to the LDMOS transistor 201.

Figure 2H:
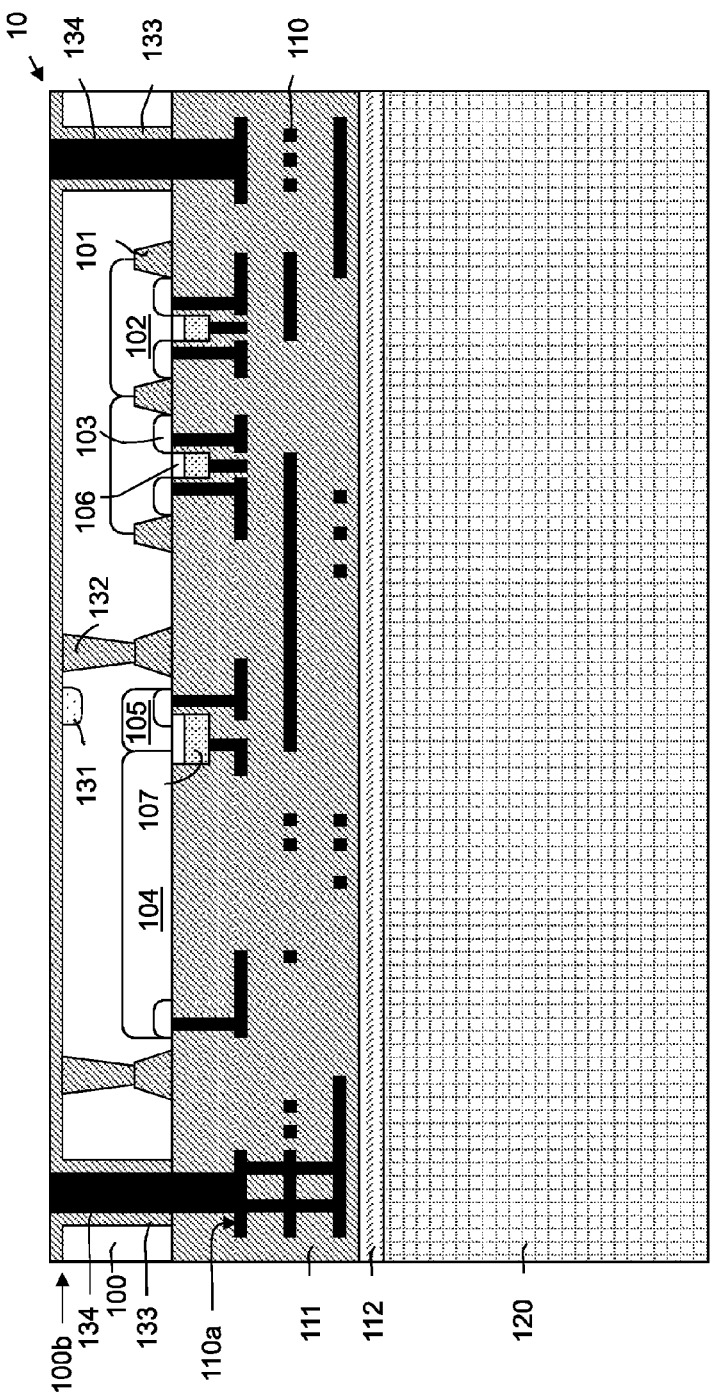

Turning now to FIG. 2H, a dielectric insulating liner 133 is deposited on the sidewalls of the TSVs followed by a conductive filling 134 establishing metal stud 134. Sub atmospheic CVD with ozone/TEOS may be used for conformal deposition of a dielectric liner in the TSVs. There are other possibilities which are known to those skilled in the art. The dielectric liner prevents an electrical connection of the via to the silicon. The dielectric liner 133 must be opened at the bottom of the TSV before filling with conductive material. The conductive filling 134 may be a metal layer such as aluminum, tungsten or copper. The choice of the metal may depend on the lateral size and the aspect ratio of the TSV. Before the deposition of the metal layer, a barrier layer is usually deposited, for example Ti/TiN. After metal filling the horizontal portions of the deposited conductive material are removed from the backside by etchback or CMP depending on the material used. As a result, the metal area 134 of the TSVs are available on the thinned backside 100b of wafer 10. During operation of the devices, a signal or current or voltage produced on the frontside of the wafer are available on its backside what is enabled by the thinned wafer 10 and would be more complicated to achieve or even impossible with conventional manufacturing processes that do not use a thinning of the device wafer when connected to a carrier wafer, as described above.

Specifically, the conductive filling 134 contacts the surface 110a of the wiring layer 110 that has been exposed in the via 149. Accordingly, an electrical contact is established between the wiring layer 110 embedded in the dielectric layer 111 on the frontside of the wafer 10 through the via 149 to the backside of the wafer 10. Provided that the portion of metal surface 110a is connected to the drain of the LDMOS transistor 201, the current from the drain is available at the conductive filling 134 on the backside of the wafer and can be accessed from externally of the device or can be routed to the backside to other devices (not shown in the drawings) such as other power MOS or bipolar transistors fabricated in the same wafer 10 or to the CMOS circuit 200. Accordingly, the drain connection of the LDMOS transistor is routed to the rear or backside of the wafer so that it can be connected to features accessible from the backside.

Figure 2I:
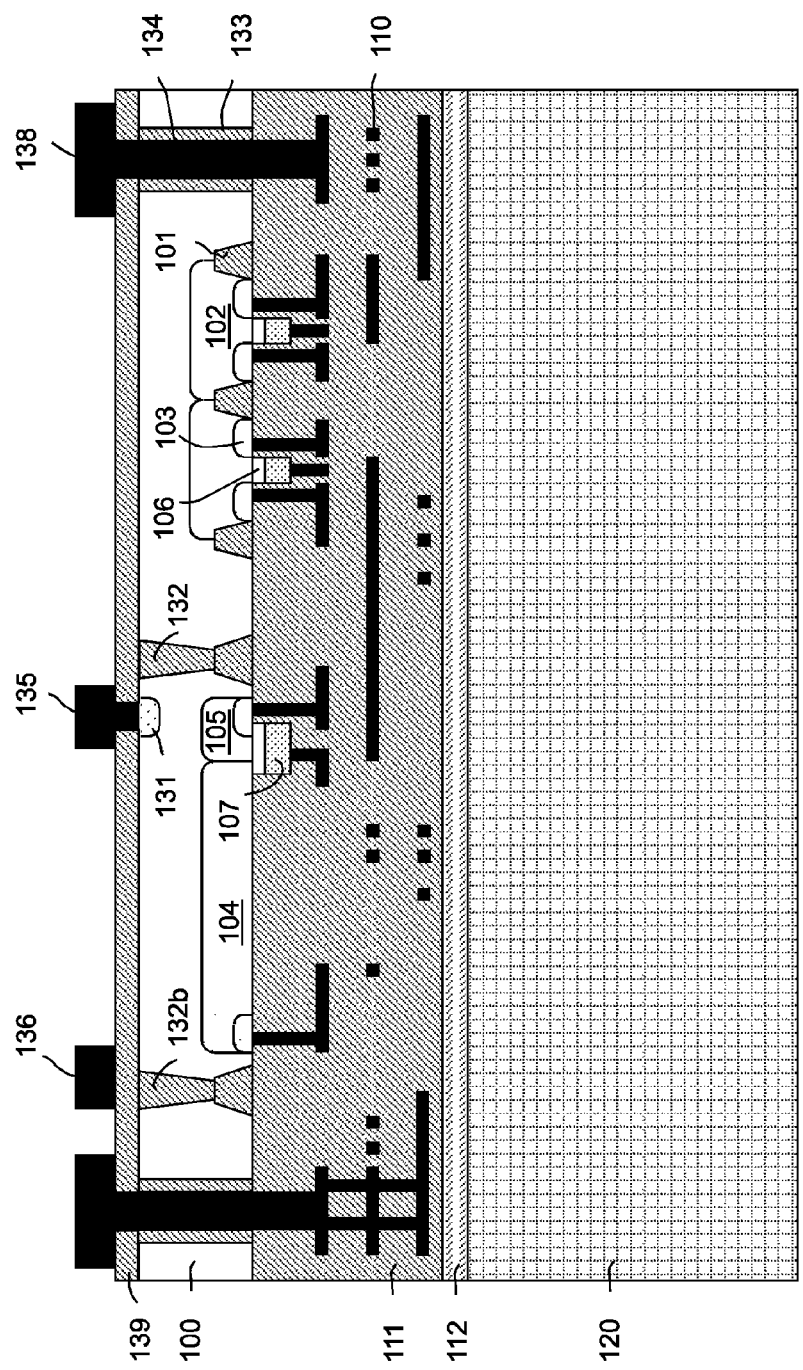

Turning now to FIG. 2I, an embodiment for backside processing is shown. A dielectric layer, for example, a silicon dioxide layer 139 is deposited and opened at those positions where the metal fillings 134 disposed in the TSVs are located, where metal contacts are to be formed. Metal is deposited on the wafer backside on the silicon dioxide layer 139 and structured. An ohmic metal contact 135 is formed on the backside for the body contact of the LDMOS transistor. A metal wiring 136 on the silicon dioxide layer is formed as well. The metal wiring 136 may serve to connect features disposed on the backside of the wafer with each other. The metal wiring 136 may connect other metal areas disposed on the isolation layer 136. Bonding pads 138 are formed so that a current or voltage can be supplied to the external of the device. The thickness of the metal layer disposed on the wafer back-side forming the bonding pads and backside wirings are sufficiently thick so that they can carry relatively large currents. Because the metal layer on the wafer backside can be made thicker and/or the cross-section of a pad or wiring on the wafer backside can be made larger when compared to the wafer frontside, larger electrical currents can be transported on the wafer backside when compared to the wafer frontside. Furthermore, connections can be created between backside contacts and bonding pads, and field plates can be defined used for the optimization of the device characteristics of certain high voltage transistors (not shown). The CMOS circuit may control the operation of the LDMOS device. The CMOS circuit may be operatively connected to the LDMOS device to control the switch state of the LDMOS device and switch the LDMOS device on or off depending on the power function to be performed. For example, the CMOS circuit may be connected to the gate electrode of the LDMOS transistor to control the switch state of the LDMOS transistor. This connection may be established at the frontside of the wafer through the wiring layer 110. The CMOS circuit may as well be connected to a drain signal of the LDMOS transistor to control the switch state of the LDMOS transistor in response to the drain signal of the LDMOS transistor. This requires a connection from the drain to the CMOS circuit, for example, by use of a through silicon via that passes the drain signal available on the backside of the wafer to the CMOS circuit on the frontside.

Figure 2J:
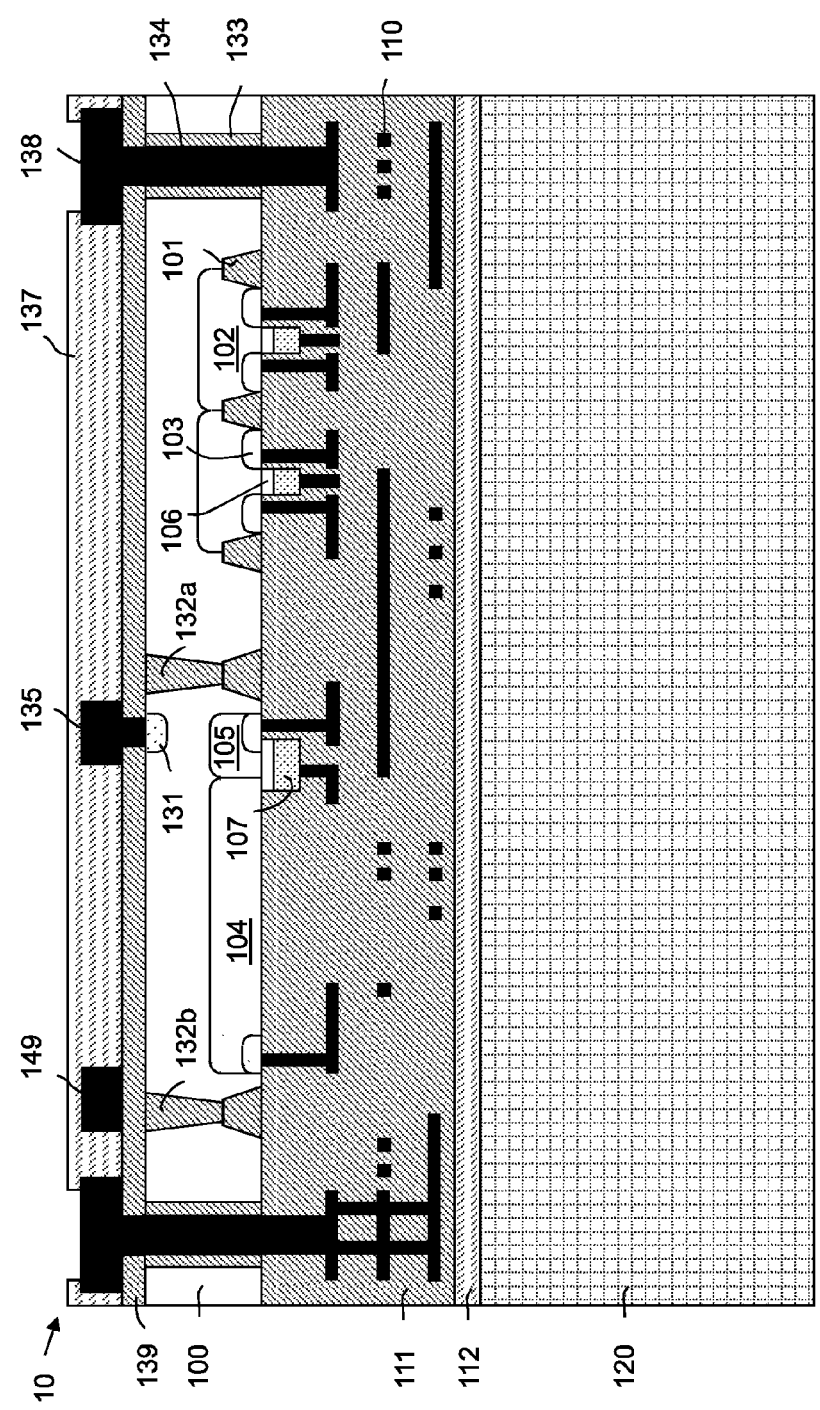

Turning now to FIG. 2J, a passivation 137 is deposited on the wafer backside with opening of bonding pads. With the boding pads available on the backside, it can be considered to mount the finished wafer on another device wafer to realize a 3D integration.

A layout of a power chip including the LDMOS and CMOS devices shown in FIG. 2J comprises deep trench isolations such as 132a, 132b formed from the wafer backside which are used to effectively isolate single high voltage transistors from each other and from the chip area with low voltage transistors and passive devices as the standard CMOS devices. In an embodiment, the deep trenches 132a, 132b including the shallow trenches 101a, 101b that cooperate with the deep trenches completely surround the high voltage transistors so as to form an edge termination for each of these transistors. While FIG. 2J shows only a cross-section of the deep trench and shallow trench isolations, a skilled person will understand that such trenches form a continuous and contiguous isolation ring surrounding the LDMOS transistor. The continuous isolation ring may have the shape of a square or a rectangle seen from the backside of the wafer. The logic and control circuit such as the CMOS circuit can be realized outside this isolation ring. For example, the CMOS circuit may be part of the control circuit that controls the switch state of the LDMOS transistor. The CMOS circuit may be representative of a relatively high number of electronic circuit elements such as NMOS and PMOS logic transistors forming the CMOS circuit of which only a subset of transistors are shown in FIG. 2J. For lateral high voltage transistors like the LDMOS, surrounding deep trench isolations can help to reduce leakage and parasitic capacitances. With deep trench isolations a denser packaging of low and high voltage transistors can be accomplished resulting in lower silicon area consumed. As the bonding pads such as 138 are on the wafer backside, through silicon vias are necessary to connect metal pads on the wafer frontside with the bonding pads on the wafer back-side. Depending on the size of the through silicon vias multiple vias can be used to establish a contact between the metal pad on the wafer frontside and the bonding pad on the backside.

Through silicon vias can be used to integrate vertical high voltage transistors in a Power IC. With through silcon vias all terminals of a vertical high voltage transistor can be brought to the wafer backside. Through silicon vias could also be useful for specific lateral or vertical high voltage transistors. For instance, a through silicon via could connect a field plate on the wafer backside to an interconnect line on the frontside.

As an alternative to filling the through silicon vias with a conductive material such as a metal stud 134, a connection from the wiring layer 110 through the via 148 to the external of the wafer may be made with a bond wire (not shown) replacing the corresponding bonding pad 138. In this case it is required that the width of the via 148 is sufficiently large so that a wire can be bonded to the bottom of the via to make electrical contact to the wiring layer 110. The bond wire is bonded to the bottom of the through silicon via which may be the wiring layer 110 and extends through the TSV to a terminal external to the wafer.

Figure 3:
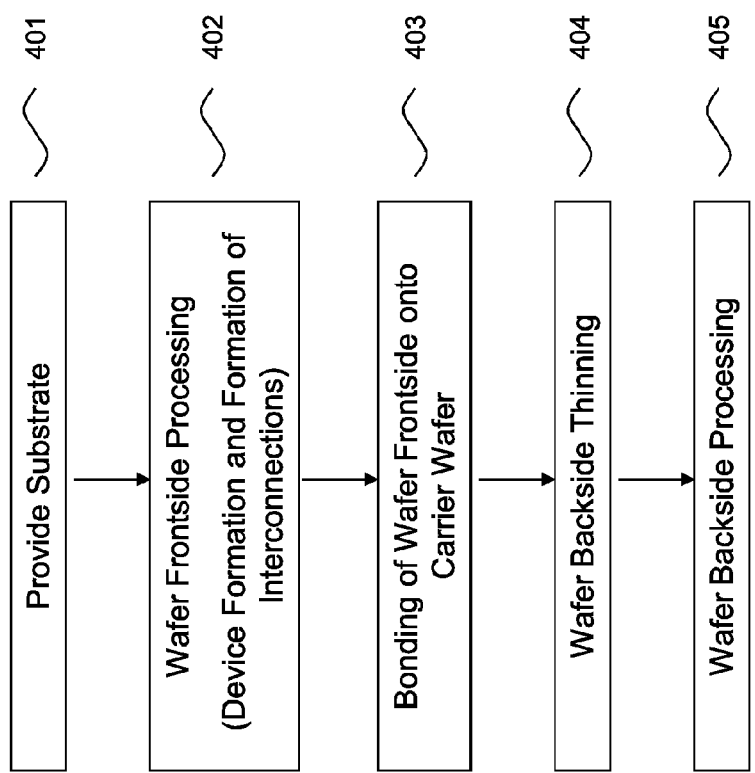
FIG. 3 shows a diagram depicting a process flow of a method to fabricate one or more transistors on a wafer.

With regard to FIG. 3, a diagram depicting a process flow of a method to fabricate one or more transistors on a wafer is shown. A doped semiconductor substrate is provided such as a semiconductor wafer (step 401). The semiconductor wafer is processed from its frontside (step 402) which includes the formation of one or more doping areas that may comprise doping areas at a higher dopant concentration or a lower concentration or doping wells. Frontside processing may also comprise the formation of gate oxides and gate electrodes. The gate electrodes and gate oxides may be located in trenches within the substrate or on top of the surface of the substrate. Frontside processing includes also the deposition of one or more dielectric layers on top of the frontside of the substrate. The one or more dielectric layers embed one or more metal layers that provide wirings or interconnections between the doping areas and gate electrodes within one of the devices and also between one device and another device.

After having been processed from the frontside the wafer is attached or bonded to a carrier wafer (step 403). The frontside of the semiconductor wafer, in particular the surface of the dielectric layer that embeds the wirings, is bonded to a surface of the carrier wafer by suitable bonding processes.

The semiconductor wafer is then thinned from the backside (step 404), which includes the removal of substrate material from the backside of a semiconductor wafer.

While the frontside of the semiconductor wafer is covered with the bonded carrier wafer, the fabrication of the transistors and interconnections of the transistors to form an electrical circuit is completed by a processing from the backside (step 405). The backside processing includes several steps to complete the device that have already been pre-processed from the frontside and includes steps to make interconnections between frontside and backside of the wafer and between one or more devices on the wafer.

Figure 4A:
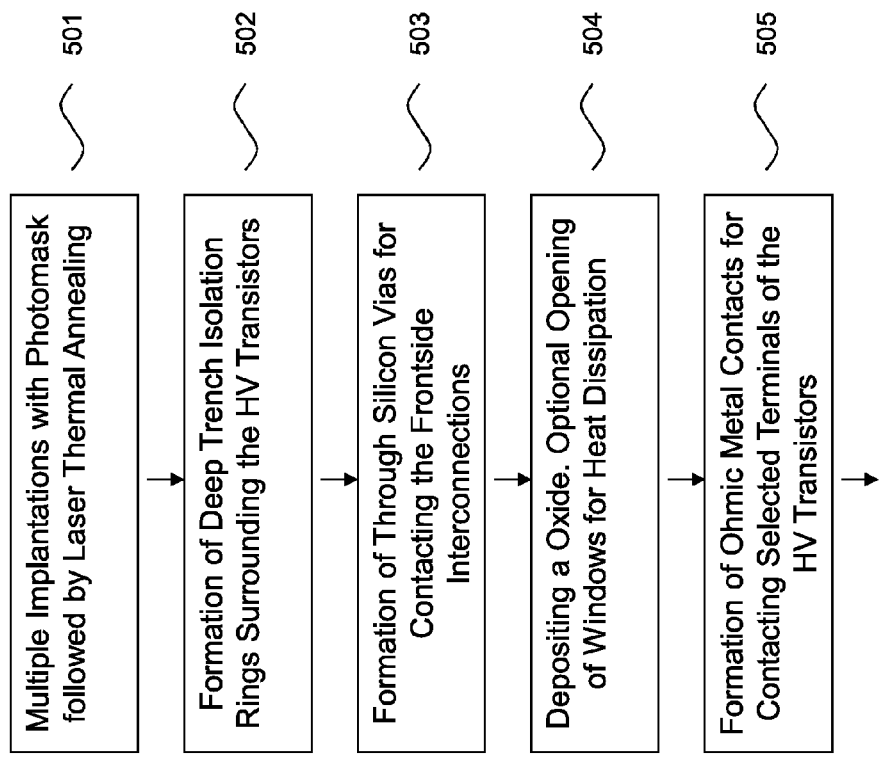
FIGS. 4A to 4B show a diagram depicting a more detailed process flow of the method to fabricate one or more transistors.
Figure 4B:

FIGS. 4A and 4B show a diagram depicting the steps and options for the process flow of the backside processing (step 405) in more detail. Multiple implantations are performed with a corresponding photomask followed by a laser thermal anneal (step 501). Implantations can have several purposes: contact implants for contacting terminals of the high voltage transistor on the backside, formation of deep doping regions when implantation from wafer frontside is technically not feasible anymore, a collector implant for a vertical IGBT, etc. Laser thermal annealing facilitates activation of the introduced dopants without heat exposure to the wafer frontside.

Deep trench isolations are formed from the backside which extend vertically through all silicon from the wafer backside to the wafer frontside so that they can effectly isolate the high voltage transistors from the standard CMOS area of the die (step 502). A deep trench isolation ring surrounding the high voltage transistor can be formed. The deep trenches can land on the bottom of shallow trench isolations formed on the wafer frontside which is the preferred way. They can also land on the pre-metal dielectric disposed on the wafer frontside. Deep trenches can be etched using standard etching techniques. The filling could be accomplished with sub atmospheric ozone/TEOS CVD, high density plasma (HDP) CVD silicon dioxide deposition, or spin-on dielectrics (e.g. benzocyclobutene) or similar materials.

The formation of through silicon vias accomplish contacts to metal plates formed on a frontside interconnect level to make the electrical signals from the wafer frontside available to the wafer backside where the bonding pads are formed (step 503). The etching of the via may comprise two steps, a silicon etch which goes through the silicon substrate and an oxide etch which goes through the pre-metal dielectric stopping finally at the bottom the metal plate. The etching of the silicon part can be combined with the etching of the deep trenches for isolation. A dielectric liner is deposited and opened at the bottom before the via is filled with metal. Depending on the via sizes and aspect ratio, aluminum, tungsten or copper can be used as conductive material.

A dielectric layer like silicon dioxide deposited on the wafer backside can improve the isolation of the high voltage transistor, reduce leakage currents and avoid to a large extent parasitic capacitance (step 504). Higher breakdown voltages can be obtained for LDMOS transistors. The thickness of the silicon dioxide will depend on the device. The oxide on the backside also isolates interconnect lines on the wafer backside from the device silicon. Windows in the silicon dioxide layer can be etched to allow heat dissipation if needed.

Contacting selected terminals of a lateral high voltage transistor on the wafer backside can enable to handle larger current densities. Large and thick metal lines on the backside could provide low-resistance paths for the high currents. Also effective heat sinks are realized in this way. For the integration of vertical high voltage transistors backside contacting enables a contact of the lower or buried electrodes on the backside (step 505).

The backside processing offers opportunities to optimize electrical properties of specific high voltage transistors. A field plate formed below the drift region can improve the trade-off between on-state resistance and breakdown voltage of a LDMOS transistor (step 506).

A multilevel metallization can be realized on the wafer backside. Large and thick metal lines made of aluminum or copper can be used to transport large currents with low resistance. The dielectrics used in this metallization scheme could be PECVD silicon dioxide or spin-on dielectrics (e.g. benzocyclobutene). The metallization includes the formation of bonding pads (step 507).

A standard final passivation with openings of the bonding pads can be applied on the wafer backside (step 508).

With the above described process using a backside grinding and thinning step, it is possible to include several distinct high-voltage and/or power devices in the same wafer using substantially the same manufacturing processing steps. With a backside connection to the doping areas associated to the devices, the doping areas can be interconnected with each other. It is also possible to connect the backside doping regions to features on the frontside of the wafer such as the wiring layer in the dielectric on the frontside of the wafer, wherein one or more metal contacts are formed in through silicon vias that traverse the full depth of the thinned wafer.

Following the process state shown in FIG. 2J, the LMOS devices fabricated on a wafer can be separated by dicing or sawing so that individual integrated circuits are generated. The carrier wafer is diced at the same time and remains connected to the dies of the device wafer. As several high-voltage and/or power devices can be integrated on the same chip and connected with each other, a power on chip system including several of said high-voltage and/or power devices can be achieved.

The process allows to generate a laterally double diffused MOS transistor (LDMOS), a vertical double diffused MOS transistor (VDMOS), a vertical trench MOS transistor, a lateral gate insulated bipolar transistor, a vertical gate insulated bipolar transistor (IGBT), a vertical bipolar transistor, a junction gate field effect transistor (JFET), a super junction LDMOS transistor and a thyristor according to the above described process which includes the forming of a doping region from the frontside, the bonding of the device wafer to a carrier wafer and the thinning of the wafer backside. One or more of said transistors or a combination one or more of said transistors are disposed in and monolithically integrated in the semiconductor wafer. The transistors generate signals during operation, wherein such electrical signals are made available at the second surface of the semiconductor wafer to be output or distributed therefrom. The electrical signal can be output from the device and supplied to external circuitry. The electrical signal is available at an electrode of the device present on the thinned backside of the wafer or is passed through a through silicon via from the frontside to the backside of the wafer.

Specifically, MOS transistors such as LDMOS transistors can be economically fabricated together or in parallel to NPN or PNP bipolar transistors using many same process steps in parallel so that a power on chip (POC) system can be monolithically realized. The disclosed process achieves high-voltage devices with good characteristics at reasonable costs while devices of different operational principles can be generated which leads to enhanced flexibility in the design of the electronic system.

The FIGS. 5 to 10 show several examples of transistors that can be fabricated with the process described above. One or more of such transistors of the same type or a combination of different types can be combined on one die. Any one of the transistors shown in FIGS. 5 to 10 may be fabricated in accordance with the manufacturing processes described above including the thinning of the backside of the wafer and may be combined with the structures and elements described above. For example, the transistors of FIGS. 5 to 10 may be surrounded by deep trenches such as the deep trenches labelled with 132 and may be surrounded with shallow trenches 101a, 101b with cooperate with the deep trenches 132. Such deep and shallow trenches may surround the transistors of FIGS. 5 to 10 in continuous manner to form an isolation ring. Furthermore, via holes such as 149 may be used in connection with the transistors of FIGS. 5 to 10 to connect features disposed on the frontside of the wafer with features disposed on its backside. However, any one of the transistors shown in FIGS. 5 to 10 may be used and manufactured without the deep trenches and the shallow trenches and the via holes.

Figure 5:
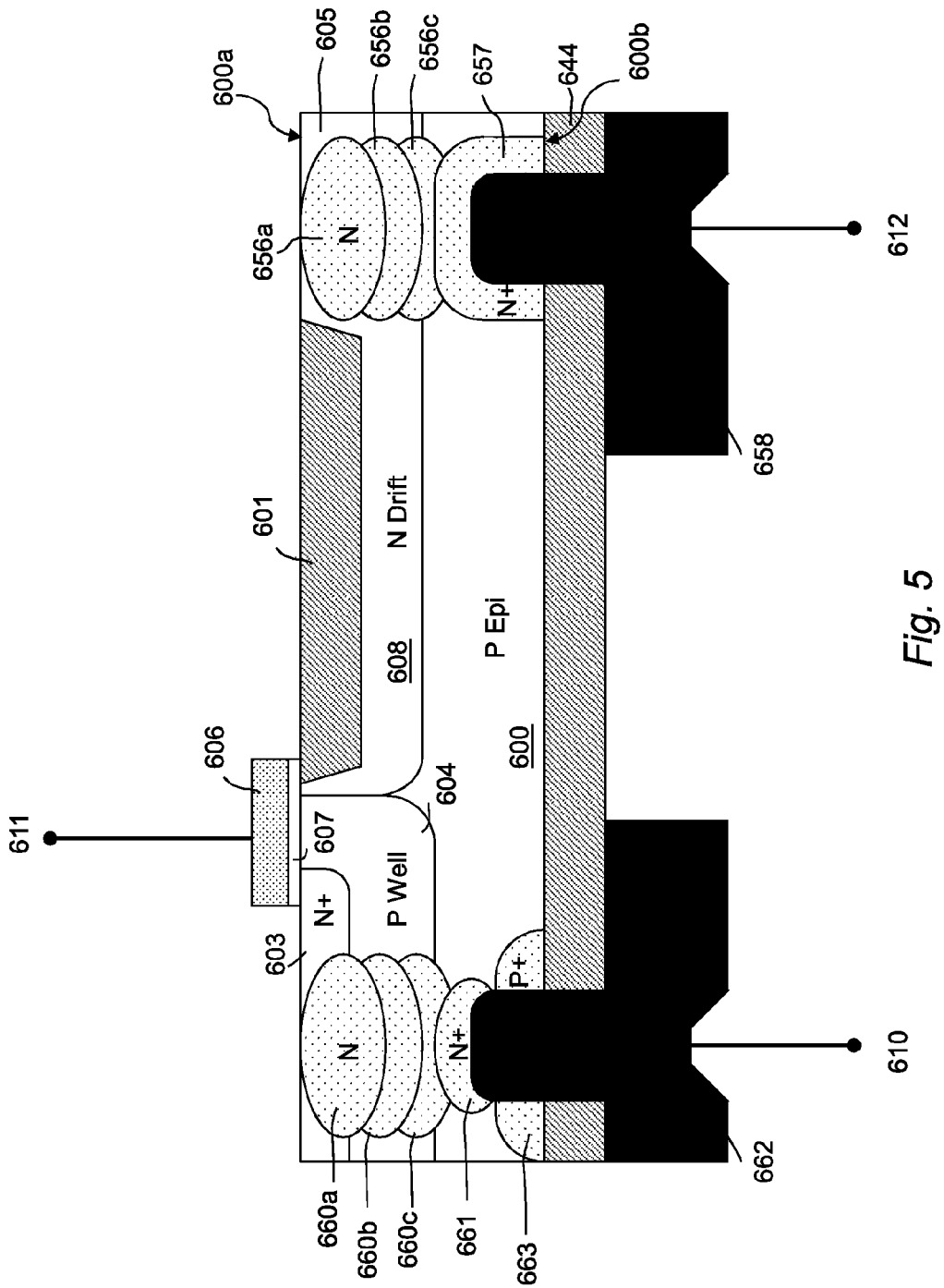
FIG. 5 shows an LDMOS transistor according to an embodiment using sinker dopings and backside connections.

FIG. 5 shows an LDMOS transistor according to an embodiment fabricated according to the methods described above which includes that the wafer is attached to a carrier wafer (not shown in FIG. 5) and is thinned to achieve a backside surface. The LDMOS transistor has source and drain contacts on the backside of the wafer. The LDMOS transistor comprises a source doping region 603, an n-drift doping region 608 beneath a shallow trench isolation 601 and a drain doping region 605. A gate polysilicon electrode 606 is disposed above a gate oxide 607. P-well 604 is disposed below gate electrode 607 forming the channel of the LDMOS transistor. The doping areas of the LDMOS transistor are formed from the frontside 600a of a p-epitaxial substrate 600. The backside 600b of the substrate 600 was thinned according to the methods described above. The backside 600b of the substrate is covered with a backside oxide 644.

In order to bring the source and drain contacts to the backside of the substrate, sinker dopings are implanted into the substrate from its frontside 600a, the sinker dopings are in contact with doping regions and metal filled trenches formed from the backside. In detail, an n-sinker doping arrangement 656a, 656b, 656c is formed from the frontside 600a of the substrate in and close to the drain region 605. The first n-sinker doping region 656a is implanted at a first relatively low depth in the drain area 609. A second n-sinker doping region 656b is formed at a depth lower than the first doping region 656a. A third and lowest doping area 656c is formed from the frontside of the wafer into the drain area of the LDMOS transistor having a depth greater than the depths of the first and the second n-sinker doping regions. The different depths can be controlled by different implantation energies of the ions during the n-sinker doping process. A similar process applies to the forming of a backside contact to the source area 603, wherein an n-sinker doping arrangement of three n-sinker doping regions 660a, 660b, 660c having different depths within the substrate are generated from the frontside 600a of the wafer.

Then, the wafer will be attached to a carrier wafer as described above, not shown in FIG. 5, so that the backside of the wafer can be thinned and the subsequent process steps can be performed from the thinned backside of the wafer. A trench is formed in the backside oxide 644 at a position where the n-sinker dopings are. The trench may optionally extend into the substrate 600. A tilted n+ implantation 657 as shown is formed from the backside into the substrate 600. The n+ implantation 657 may be untilted as well. Another trench is formed from the backside into the backside oxide 644 and optionally into the substrate 600 to contact the source sinker doping regions. An n+ doping region 661 is formed to contact the n-sinker doping arrangement 660a, 660b, 660c. Then, a metallization is deposited on the backside that fills the trenches formed in the backside oxide 644. The backside metallization may be patterned to obtain the drain and source contacts 658, 662. The backside contact to the sinker doping arrangement 660a, 660b, 660c can be combined with a p+ doping region 663 which has the function of a body contact. In this case, the metal contact 662 contacts both, the n+ backside doping 661 and the p+ body doping 663.

The n-sinkers and backside contacts are usually formed in parallel for source and drain at the same time. It is also possible to form only one backside contact for the source or one backside contact for the drain. The forming of a backside contact in accordance with FIG. 5 increases the capability to handle higher currents per silicon area for large LDMOS devices. Large metal plates such as metal plate 658 for the drain backside contact and/or metal plate 662 for the source backside contact are able to carry sufficient current for the source and/or the drain of the LDMOS power device, and assist in a dissipation of the heat generated by the large currents.

Figure 6:
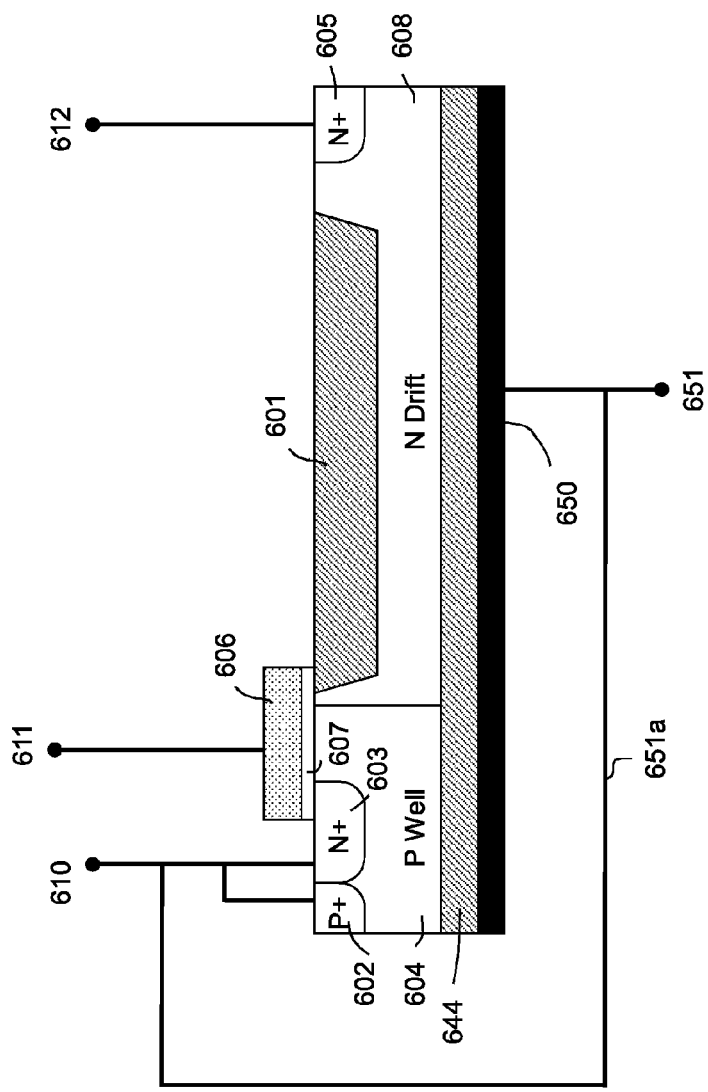
FIG. 6 shows an LDMOS transistor according to an embodiment using a field plate.

Turning now to FIG. 6, an LDMOS transistor is shown fabricated according to the methods described above that exhibits a field plate 650 on the backside of the wafer. During thinning of the substrate from the backside, the frontside of the wafer is connected to a carrier wafer (not shown in FIG. 6). Specifically, the substrate 600 has been thinned from its backside, then covered with backside oxide 644. The backside oxide 644 is covered with a metal plate 650 which functions as a field plate arranged below the LDMOS doping regions 604, 608. The field plate can be connected to the source by a through silicon via (TSV) fabricated as explained above and indicated at 651a, which means that the field plate 650 can be connected through the TSV to the frontside of the wafer where the source doping areas 602, 603 are available in the wiring layer 610. Alternatively, an external voltage or external potential can be applied to field plate 650 on its external connection 651. The electric field of the field plate can assist in the depletion of the n-drift region 608 in the off-state which allows higher dopant densities for the n-drift region. In addition, the electric field can increase the conductivity of the n-drift region in the on-state. As a result, a lower on-resistance Rdson can be achieved for a given breakdown voltage. While FIG. 6 shows an n-LDMOS transistor, a p-LDMOS transistor can be formed in a corresponding way using opposite doping polarities.

Figure 7:
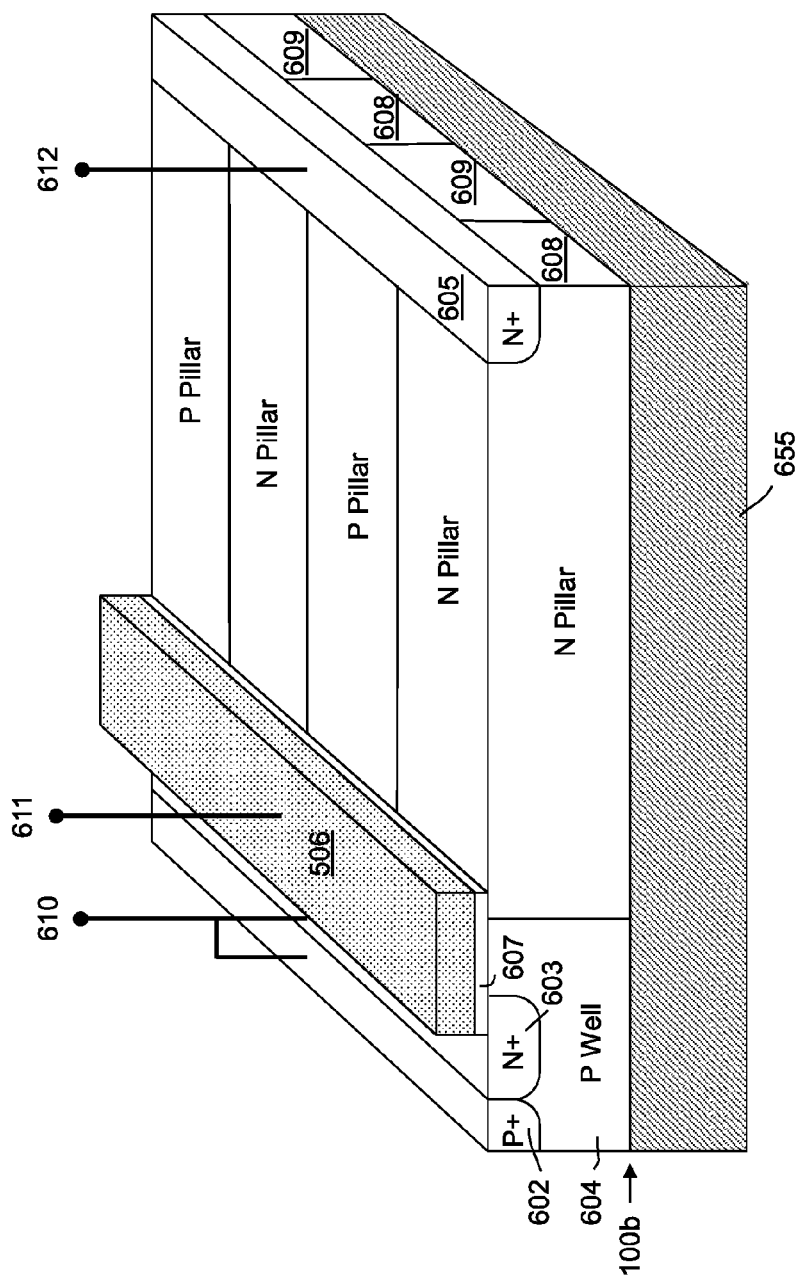
FIG. 7 shows a super junction laterally diffused MOS transistor according to an embodiment.

FIG. 7 shows a super junction LDMOS transistor fabricated according to the methods described above. In general, a better tradeoff between on-resistance Rdson and breakdown voltage can be achieved with alternating n- and p-pillars arranged in the drift region of an LDMOS transistor. The drift region is arranged between source doping region 603 and drain doping region 605. With the mutual lateral depletion of the n- and p-pillars, a higher dopant density can be used for the n-pillars for a given breakdown voltage which finally results in a lower Rdson.

The conventional super junction LDMOS transistor suffers from the so-called substrate-assisted depletion (SAD), with which the additional vertical depletion of the n-pillars by the p-substrate destroys the charge balance which is critical to achieve the high breakdown voltage. In the conventional super junction LDMOS transistor, a vertical electrical field increases towards the drain.

The super junction LDMOS transistor according to the present embodiment is fabricated according to the methods described above, which includes that the wafer is attached to a carrier wafer (not shown in FIG. 7) and is thinned to achieve a backside surface 100b of the substrate so that the thinned backside surface reaches and is in contact with the bottom surfaces of the n- and p-pillars, as shown in FIG. 7. Then, a silicon dioxide 655 is deposited on the thinned backside 100b of the substrate. By this measure, the substrate-assisted depletion (SAD) is avoided because there is substantially no silicon substrate beneath the p-well 604 and the n- and p-pillars 608, 609 of the drift area of the LDMOS transistor. FIG. 7 shows a super junction n-LDMOS transistor, while a super junction p-LDMOS transistor can be formed in a corresponding way with opposite doping polarities.

Figure 8:
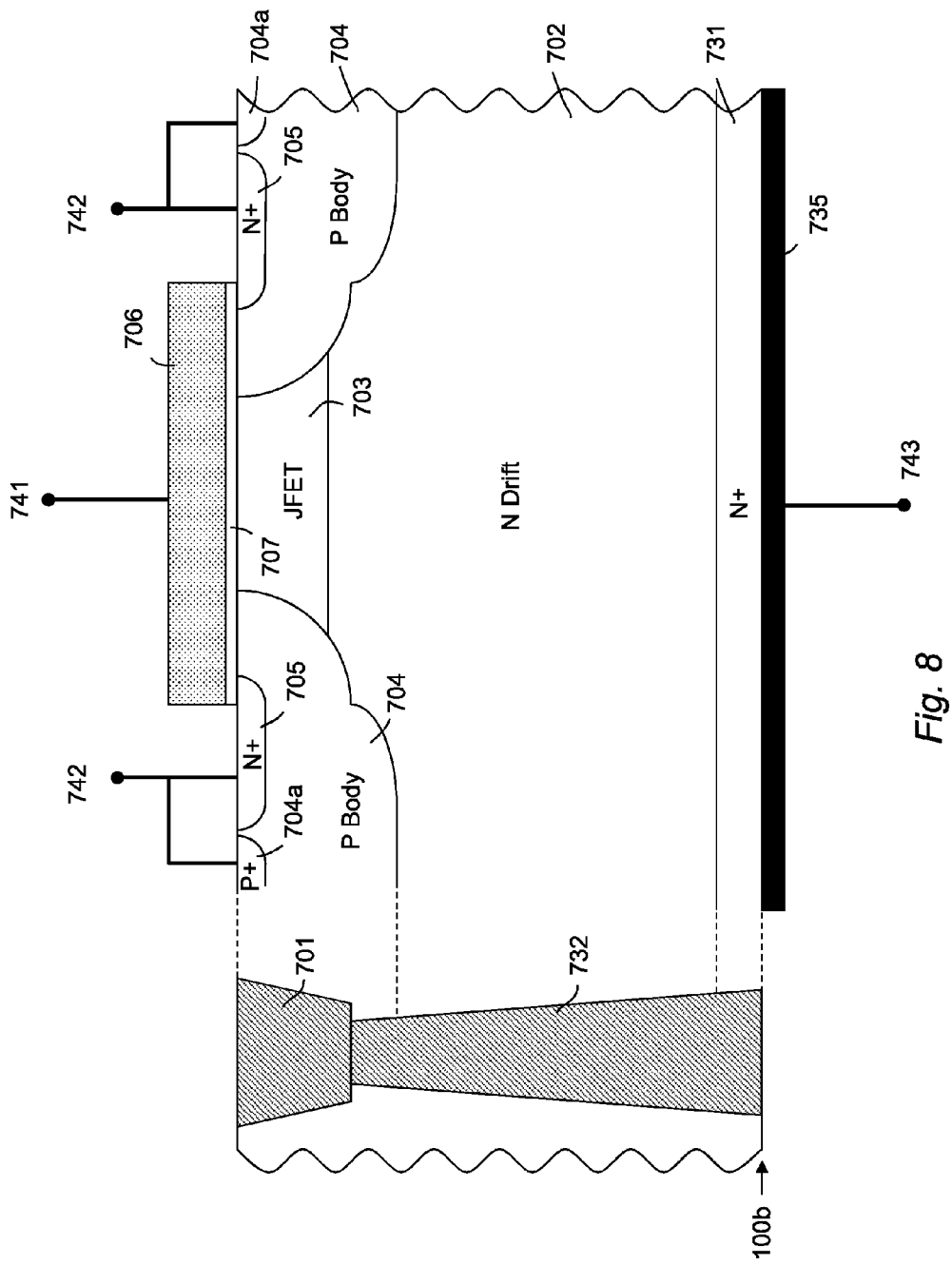
FIG. 8 shows a vertical double diffused MOS transistor according to an embodiment.

FIG. 8 shows a vertical DMOS transistor manufactured according to the methods described above which includes that the wafer is attached to a carrier wafer (not shown in FIG. 8) and is thinned to achieve a backside surface 100b. The vertical DMOS transistor comprises an n-drift region 702 disposed in the substrate. P-body doping regions 704 include n+ source doping areas 705. A JFET doping region 703 may be formed between the p body regions 704. A polysilicon gate electrode 706 is disposed on a gate oxide 707 extending from one n+ source doping region 705 to another n+ source doping region 705. A p+ body contact 704a is disposed within the p body region 704 connected to the n+ source region 705. A shallow trench isolation 701 is formed from the frontside of the wafer. Then, the frontside of the wafer is connected to a carrier wafer (not shown) so that the backside of the wafer can be thinned up to a surface 100b. A deep trench isolation 732 is formed from the thinned backside to land on the bottom surface of the shallow trench isolation 701. Trench isolations 701, 732 surround the vertical DMOS transistor and isolate it from other features or circuits integrated on the same die. Enabled by the present invention is an n+ drain contact implantation 731 performed from the wafer backside. The implantation of the n+ drain contact 731 can be followed by a laser thermal anneal (LTA). An ohmic metal contact 735 is formed on the wafer backside on the n+ drain contact 731 in the region of the vertical DMOS transistor. The backside drain contact 735 may be electrically connected by a metal line to other elements on the wafer backside or may be electrically contacted to features on the frontside of the wafer by a through silicon via, the generation of which has been described above.

A vertical trench MOS transistor can be formed in a similar way, wherein the gate oxide and the gate electrode are formed in a trench extending from the frontside of the wafer into the substrate.

Figure 9:
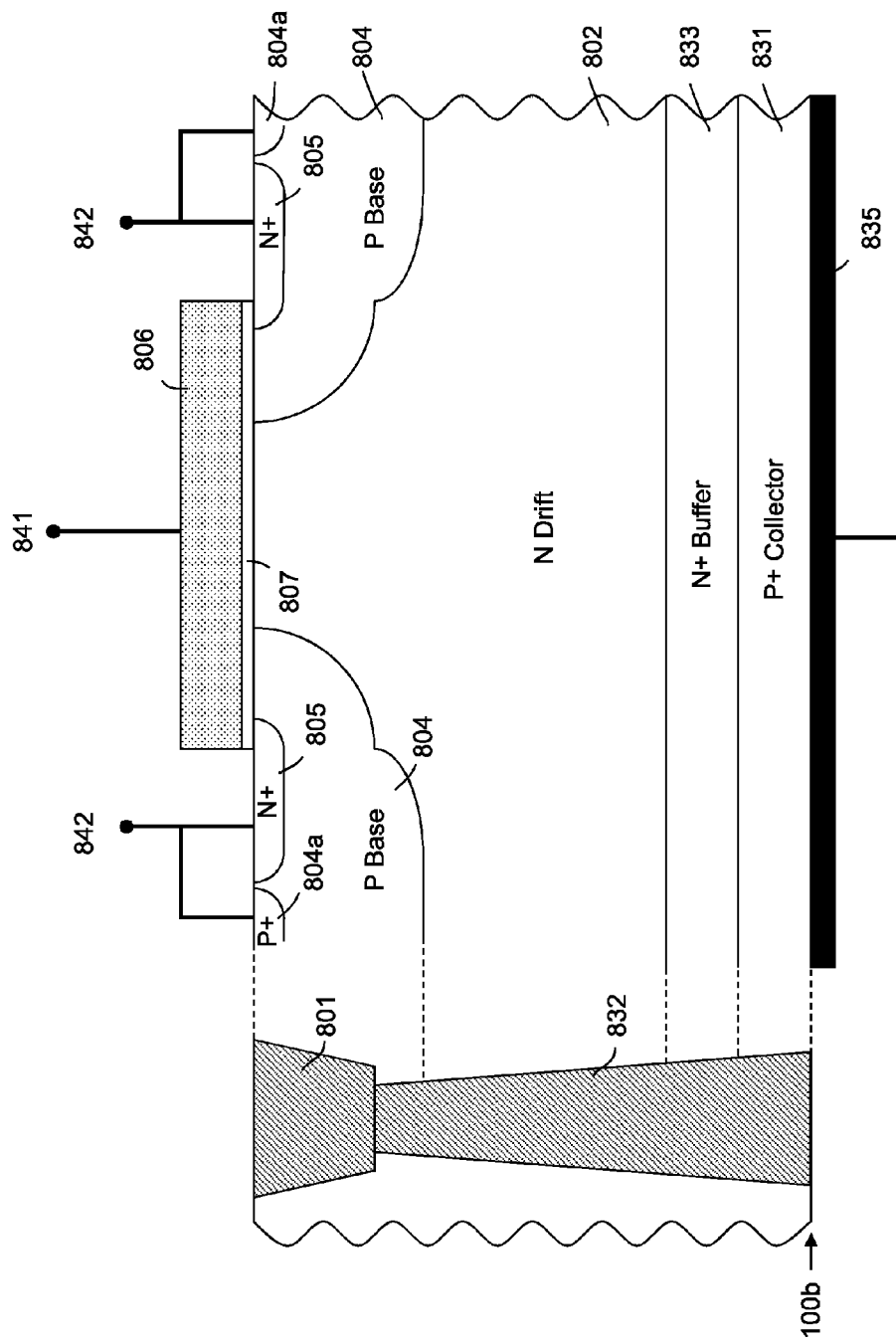
FIG. 9 shows a vertical insulated gate bipolar transistor according to an embodiment.

FIG. 9 shows a vertical isolated gate bipolar transistor (IGBT) which has a structure similar to the vertical DMOS transistor of FIG. 8, furthermore comprising a p+ collector region 831 formed adjacent to the thinned surface 100b. An n+ buffer layer 833 can be formed from the thinned backside 100b within the n drift region 802 before the p+ collector 831 is formed. The n+ buffer layer 833 is optional. The collector implantation 831 is connected to a metal backside connection 835. The electrodes 842 are the emitter electrodes of the vertical IGBT connected to the emitter doping region 805, wherein the p doping regions 804 are the base electrodes.

The p+ drain collector region 831 is implanted from the wafer backside followed by laser thermal annealing. Often times, the n+ buffer layer 833 is used buried between the p+ collector 831 and the n drift region 802. The respective implantation for the n+ buffer layer 833 is performed from the thinned wafer backside. An ohmic metal contact 835 is formed on the wafer backside in the IGBT region. The collector plate 835 of the IGBT can be electrically contacted by a through silicon via to the frontside of the wafer or by a metal line to other elements on the wafer backside. Deep trench isolations 832 formed from the wafer backside and shallow trench isolations 801 formed from the wafer frontside that surround the vertical IGBT and that isolates the area of the vertical IGBT from other structures also formed in the same semiconductor die.

Figure 10:
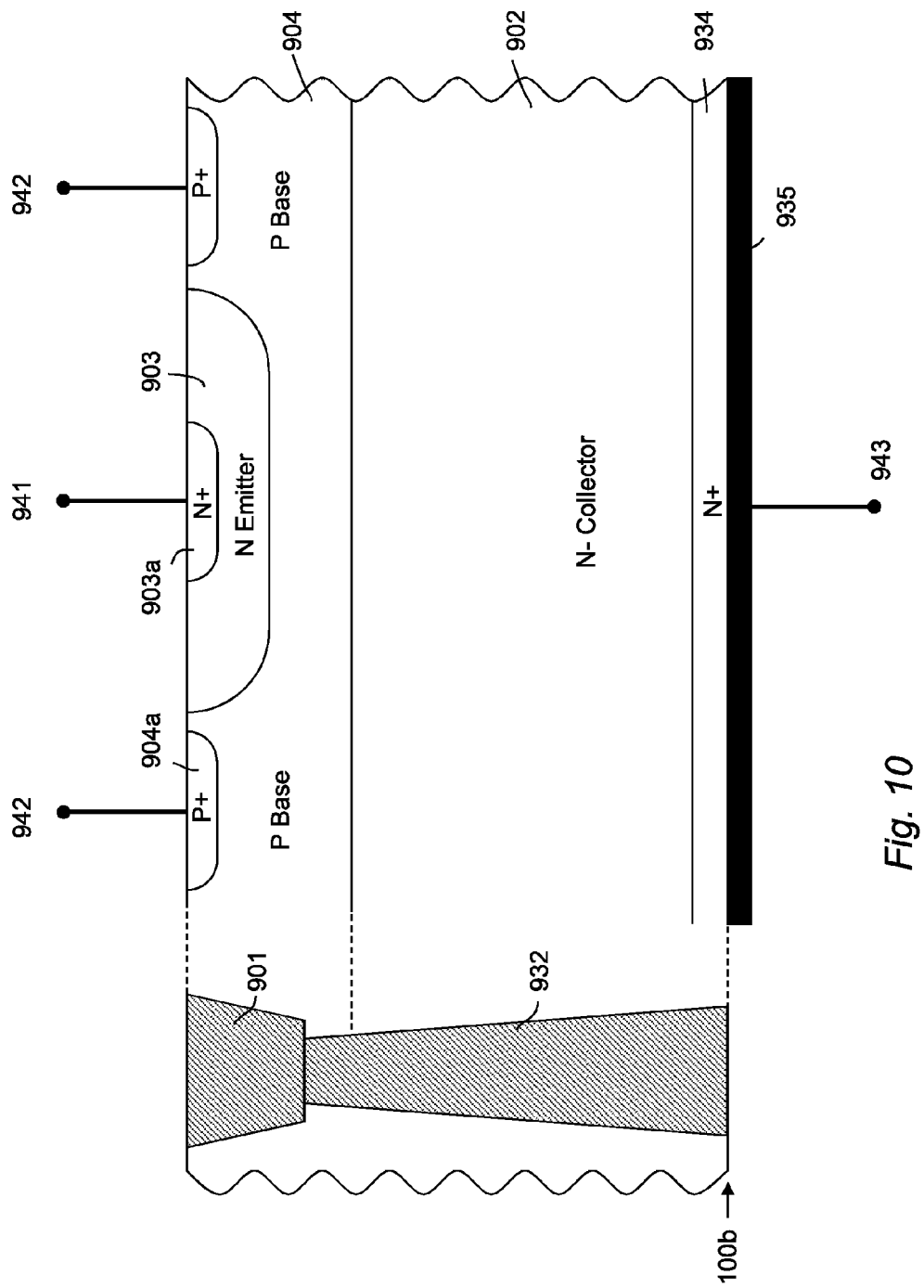
FIG. 10 shows a vertical bipolar transistor according to an embodiment.

FIG. 10 shows a vertical bipolar transistor manufactured according to the methods described above which includes that the wafer is attached to a carrier wafer (not shown in FIG. 10) and is thinned to achieve a backside surface. Shown is a vertical NPN bipolar transistor while a vertical PNP bipolar transistor can be formed in a corresponding way with opposite doping polarities. The vertical bipolar transistor shown in FIG. 10 comprises a base doping region 904 formed from the frontside of the wafer. The base 904 includes p+ base contact implantations 904a and an n-emitter implantation 903 including an n+ emitter contact implantation 903a, all processed from the frontside of the wafer. The n-collector 902 is formed between the base area 904 and the wafer backside. After attaching the device wafer to a carrier wafer (not shown) and thinning the backside of the wafer to the thinned backside surface 100b, an n+ collector implant 934 is formed adjacent to the thinned wafer backside. The n+ collector contact implantation is performed from the wafer backside followed by laser thermal annealing. An ohmic metal contact 935 is formed on the thinned wafer backside in the region of the NPN bipolar transistor. The collector plate 935 of the transistor can be electrically contacted by a through silicon via to structures on the frontside of the wafer or by a metal line to elements present on the wafer backside.

Deep trench isolations 932 formed from the thinned wafer backside and shallow trench isolations 901 formed from the wafer frontside surround the vertical NPN bipolar transistor.

A vertical thyristor can be fabricated in a similar way. It has a NPNP structure with the cathode and the gate on the frontside of the wafer. The anode of a vertical thyristor can be realized on the thinned wafer backside by P+ implantation followed by laser thermal annealing and forming an ohmic metal contact on that surface.

The backside processing can also be useful to fabricate a junction gate field effect transisfor (JFET). In this device the current flowing through the channel is modulated by the combined action of two gates which are in contact with doping regions having the opposite polarity as the channel region. With the backside processing the second gate of the JFET can be formed on the thinned wafer backside. Both gates are ohmic metal contacts. For a n-channel JFET the gates are each in contact with a P doping region. For the gate on the wafer backside the P doping region can be created by implantation and laser thermal annealing on the thinned backside. With a TSV the gate on the wafer backside can be electrically shorted with the gate on the frontside as required for this device. A p-channel JFET can be formed in a corresponding way with opposite doping polarities.

A method of fabricating a semiconductor product includes the processing of a semiconductor wafer from a front surface including structures disposed in the substrate of the wafer adjacent to the front surface and the forming of at least one wiring embedded in a dielectric layer disposed on the front surface of the wafer. The semiconductor wafer is mounted to a carrier wafer at its front surface so that material can be removed from the backside of the wafer to thin the semiconductor wafer. Backside processing of the semiconductor wafer includes the forming of implantations from the backside of the wafer, the forming of deep trenches to isolate the structures from other structures within the wafer, the forming of a through silicon via to contact features on the frontside of the wafer and the forming of a body contact. Several devices can be generated within the same wafer.

The invention claimed is:

1. A method of fabricating a semiconductor device, comprising the steps of:
   providing a semiconductor wafer having a semiconductive substrate, a first surface and a second surface, the first and second surfaces disposed on opposite sides of the substrate;
   processing the semiconductor wafer at the first surface, comprising:
     forming at least one doping region disposed in the substrate adjacent to the first surface;
     forming at least one dielectric layer and forming at least one wiring, the at least one dielectric layer disposed on the first surface and the at least one wiring embedded in the at least one dielectric layer; and providing a carrier wafer and attaching the carrier wafer to the semiconductor wafer so that the first surface of the semiconductor wafer faces towards the carrier wafer; and processing the semiconductor wafer at the second surface, comprising:

thinning the semiconductor wafer by removing material from the second surface of the substrate;

forming at least one via hole in the substrate extending from the thinned second surface to the wiring; and forming an electrically conductive path that is coupled to the wiring and that extends through the at least one via hole to the thinned second surface of the semiconductor wafer;

the method further comprising the steps of:

forming at least one deep trench in the substrate extending from the thinned second surface and filling the at least one deep trench with an insulating material to form a barrier between the at least one doping region and another semiconductor device including a doping region other than the at least one doping region;

forming at least one shallow trench in the substrate extending from the first surface before the step of attaching the semiconductor wafer to the carrier wafer; and filling the at least one shallow trench with an insulating material, wherein the step of forming the at least one deep trench includes forming the at least one deep trench to extend from the thinned second surface to the insulating material filled in the at least one shallow trench.

2. The method according to claim 1, wherein the step of forming an electrically conductive path comprises:

filling the at least one via hole with a conductive material or with a metal filling; or forming a bonding wire extending within the at least one via hole to electrically contact the wiring; and establishing electrical contact from the wiring to a feature disposed at the thinned second surface of the semiconductor wafer.

3. The method according to claim 1, further comprising:

forming a laterally diffused MOS transistor having a source doping region, a drain doping region, a drift region, a body region and a gate electrode that are disposed at the first surface of the semiconductor wafer, wherein the at least one doping region is one of the source doping region and the drain doping region;

forming a doping region at the thinned second surface of the semiconductor wafer to contact the body region; and forming a metal contact at the thinned second surface of the semiconductor wafer to contact said doping region.

4. The method according to claim 3, further comprising:

forming a field plate at the thinned second surface of the semiconductor wafer comprising:

forming a dielectric layer on the thinned second surface of the semiconductor wafer; and forming a conductive layer on the dielectric layer; and connecting the conductive layer electrically to the source doping region or an external potential.

5. The method according to claim 1, further comprising:

forming sinker doping arrangement through the first surface of the semiconductor wafer before the step of attaching the carrier wafer to the semiconductor wafer, the sinker doping arrangement comprising a plurality of doping regions having different depths;

forming a metallization from the thinned second surface of the semiconductor wafer to contact at least one of the plurality of doping regions of the sinker doping arrangement.

6. The method according to claim 1, further comprising:

forming a vertical double diffused MOS transistor and/or a vertical trench MOS transistor having a source doping region, a drain doping region, a body region, a drift region and a gate electrode, wherein the source doping and the body regions and the gate electrode are formed at the first surface of the semiconductor wafer, and the drain doping region is formed at the thinned second surface of the semiconductor wafer having the same dopant polarity as the drift region; and forming a metal layer at the thinned second surface of the semiconductor wafer to establish a drain contact.

7. The method according to claim 1, further comprising:

forming a vertical insulated bipolar transistor having an emitter doping region, a collector doping region, a base doping region, a drift region and a gate electrode, wherein the emitter doping and the base regions and the gate electrode are formed at the first surface of the semiconductor wafer, and the collector doping region is formed at the thinned second surface of the semiconductor wafer having the opposite dopant polarity as the drift region; and forming a metal layer at the thinned second surface of the semiconductor wafer to establish a collector contact.

8. The method according to claim 1, further comprising:

forming a vertical NPN or PNP bipolar transistor having an emitter doping region, a collector doping region and a base doping region, wherein the emitter and base doping regions are formed at the first surface of the semiconductor wafer, and the collector doping region is formed at the thinned second surface of the semiconductor wafer; and forming a metal layer at the thinned second surface of the semiconductor wafer to establish a collector contact.

9. The method according to claim 1, further comprising:

forming a super junction laterally diffused MOS transistor having a plurality of n-doped regions and p-doped regions establishing a drift region disposed in alternating sequence adjacent to one another, wherein the plurality of n-doped and p-doped regions is formed at the first surface of the semiconductor wafer, and wherein the step of thinning the semiconductor wafer comprises removing material from the second surface of the semiconductor wafer to such an extent that the plurality of n-doped and p-doped regions reaches the thinned second surface of the semiconductor wafer.

10. A semiconductor product, comprising:

a semiconductor wafer having a semiconductive substrate and a first surface and a second surface, the first and second surfaces disposed on opposite sides of the substrate;

a carrier wafer attached to the semiconductor wafer, the first surface of the semiconductor wafer facing the carrier wafer;

at least one doping region disposed in the semiconductor substrate adjacent to the first surface;

at least one dielectric layer disposed on the first surface;

at least one wiring embedded in the dielectric layer;

at least one via hole formed in the substrate extending from the second surface to the at least one wiring;

an electrically conductive path coupled to the wiring and extending through the via hole to the second surface of the semiconductor wafer;

at least one deep trench that extends from the second surface of the semiconductor wafer to the dielectric layer disposed on the first surface of the semiconductor wafer or to the bottom of at least one shallow trench extending from the first surface into the substrate filled with insulating material thereby forming a barrier between the at least one doping region and another doping region disposed in the substrate, and wherein the at least one deep trench continuously surrounds the at least one doping region.

11. The semiconductor product according to claim 10, wherein the semiconductor wafer has a thickness (B) of between 2 to 50 micrometer, or between 2 to 25 micrometer, or between 3 to 20 micrometer.

12. The semiconductor product according to claim 10, further comprising:
a CMOS circuit comprising a p-channel MOS transistor and an n-channel MOS transistor each having a drain region, a source region and a gate electrode;
a LDMOS transistor having a drain region, a source region and a gate electrode,
wherein the CMOS circuit is operatively connected to the LDMOS transistor to control the switch state of the LDMOS transistor.

13. The semiconductor product according to claim 12, wherein the at least one deep trench and the at least one shallow trench continuously surround the LDMOS transistor to isolate the LDMOS transistor from the CMOS circuit.

14. The semiconductor product according to claim 10, wherein the semiconductor wafer includes at least one power semiconductor device which comprises one or more of a vertical power semiconductor device, a laterally diffused MOS transistor, a vertical double diffused MOS transistor, a vertical trench MOS transistor, a lateral gate insulated bipolar transistor, a vertical gate insulated bipolar transistor, a vertical bipolar transistor, a junction gate field effect transistor, a super junction LDMOS transistor and a thyristor, of which a portion comprises the at least one doping region; wherein an electrical signal generated by the at least one power semiconductor device is available at the second surface of the semiconductor wafer to be outputted or distributed therefrom.

15. The semiconductor product according to claim 10, further comprising:
a source doping region, a drain doping region, a drift region, a body region and a gate electrode that are disposed at the first surface of the semiconductor wafer, wherein the at least one doping region is one of the source doping region and the drain doping region;
a doping region at the second surface of the semiconductor wafer to contact the body region; and
a metal contact at the second surface of the semiconductor wafer to contact said doping region.

16. The semiconductor product according to claim 15, further comprising:
a dielectric layer on the second surface of the semiconductor wafer and a field plate disposed on the dielectric layer, wherein the field plate is electrically coupled to the source doping region or an external potential.

17. The semiconductor product according to claim 10, further comprising:
a sinker doping arrangement disposed in the semiconductor wafer, the sinker doping arrangement comprising a plurality of doping regions having different depths;
a metallization at the second surface of the semiconductor wafer to contact at least one of the plurality of doping regions of the sinker doping arrangement.

18. The semiconductor product according to claim 10, further comprising:
a vertical double diffused MOS transistor and/or a vertical trench MOS transistor having a source doping region, a drain doping region, a body region, a drift region and a gate electrode, wherein
the source doping and the body regions and the gate electrode are disposed at the first surface of the semiconductor wafer, and
the drain doping region is disposed at the second surface of the semiconductor wafer having the same dopant polarity as the drift region; and
a metal layer disposed at the second surface of the semiconductor wafer to establish a drain contact.

19. The semiconductor product according to claim 10, further comprising:
a vertical insulated bipolar transistor having an emitter doping region, a collector doping region, a base doping region, a drift region and a gate electrode, wherein
the emitter doping and the base regions and the gate electrode are disposed at the first surface of the semiconductor wafer, and
the collector doping region is disposed at the thinned second surface of the semiconductor wafer having the opposite dopant polarity as the drift region; and
a metal layer disposed at the thinned second surface of the semiconductor wafer to establish a collector contact.

20. The semiconductor product according to claim 10, further comprising:
a vertical NPN or PNP bipolar transistor having an emitter doping region, a collector doping region and a base doping region, wherein
the emitter and base doping regions are disposed at the first surface of the semiconductor wafer, and
the collector doping region is disposed at the thinned second surface of the semiconductor wafer; and
a metal layer disposed at the thinned second surface of the semiconductor wafer to establish a collector contact.

21. The semiconductor product according to claim 10, further comprising:
a super junction laterally diffused MOS transistor having a plurality of n-doped regions and p-doped regions establishing a drift region disposed in alternating sequence adjacent to one another, wherein
the plurality of n-doped and p-doped regions is disposed at the first surface of the semiconductor wafer and reaches the second surface of the semiconductor wafer; and
an isolation region disposed on the second surface of the semiconductor wafer.

* * * * *